United States Patent
Nishida et al.

(10) Patent No.: US 10,557,191 B2
(45) Date of Patent: Feb. 11, 2020

(54) METHOD FOR PRODUCING DEPOSITION MASK, DEPOSITION MASK, AND METHOD FOR PRODUCING ORGANIC SEMICONDUCTOR DEVICE

(71) Applicant: Sakai Display Products Corporation, Sakai-shi, Osaka (JP)

(72) Inventors: Koshi Nishida, Sakai (JP); Susumu Sakio, Sakai (JP); Katsuhiko Kishimoto, Sakai (JP)

(73) Assignee: Sakai Display Products Corporation, Osaka (JP)

(*) Notice: Subject to any disclaimer, the term of this patent is extended or adjusted under 35 U.S.C. 154(b) by 0 days.

(21) Appl. No.: 16/315,327

(22) PCT Filed: Jan. 31, 2017

(86) PCT No.: PCT/JP2017/003409
§ 371 (c)(1),
(2) Date: Feb. 21, 2019

(87) PCT Pub. No.: WO2018/142464
PCT Pub. Date: Aug. 9, 2018

(65) Prior Publication Data
US 2019/0211436 A1 Jul. 11, 2019

(51) Int. Cl.
*H01L 51/00* (2006.01)
*C23C 14/04* (2006.01)
*H01L 51/56* (2006.01)

(52) U.S. Cl.
CPC ............ *C23C 14/042* (2013.01); *H01L 51/00* (2013.01); *H01L 51/0011* (2013.01); *H01L 51/56* (2013.01)

(58) Field of Classification Search
CPC .......................... H01L 51/0011; C23C 14/042
See application file for complete search history.

(56) References Cited

U.S. PATENT DOCUMENTS 6,339,462 B1* 1/2002 Kishimoto .......... G02F 1/13394
349/156
6,721,024 B1* 4/2004 Kishimoto ........ G02F 1/133707
349/123
(Continued)

FOREIGN PATENT DOCUMENTS

JP 2009-167471 A 7/2009
JP 2013-055039 A 3/2013
(Continued)

OTHER PUBLICATIONS

Decision to Grant for related Japanese Application No. 2017-566424 dated Aug. 21, 2018.
(Continued)

*Primary Examiner* — Cachet I Proctor
(74) *Attorney, Agent, or Firm* — Renner, Otto, Boisselle & Sklar, LLP

(57) ABSTRACT

A method for manufacturing a vapor deposition mask (100) including a resin layer (10), and a magnetic metal body (20) formed on the resin layer (10), the method including the steps of: (A) providing a magnetic metal body (20) having at least one first opening (25); (B) providing a substrate (60); (C) forming a resin layer (10) by applying a solution including a resin material or a varnish of a resin material on a surface of a substrate (60), and then performing a heat treatment thereon; (D) securing the resin layer (10) formed on the substrate (60) on the magnetic metal body (20) so as to cover the at least one first opening (25); (E) forming a plurality of second openings (13) in a region of the resin layer (10) that is located in the at least one first opening (25) of the magnetic metal body (20); and (F) after the step (E), removing the substrate (60) from the resin layer (10).

20 Claims, 26 Drawing Sheets

(56) References Cited

U.S. PATENT DOCUMENTS

| | | | |
|---|---|---|---|
| 2005/0166842 A1* | 8/2005 | Sakamoto | C23C 14/042 118/721 |
| 2011/0048323 A1 | 3/2011 | Kondo et al. | |
| 2013/0040047 A1 | 2/2013 | Karaki | |
| 2014/0199808 A1* | 7/2014 | Sugimoto | B05B 12/20 438/99 |
| 2015/0283651 A1 | 10/2015 | Kudo et al. | |
| 2015/0368785 A1* | 12/2015 | Nam | C23C 14/042 427/555 |
| 2017/0362698 A1* | 12/2017 | Kobayashi | C23C 16/04 |
| 2018/0148822 A1 | 5/2018 | Takeda et al. | |

FOREIGN PATENT DOCUMENTS

| | | |
|---|---|---|
| JP | 2013-095993 A | 5/2013 |
| JP | 2013-142195 A | 7/2013 |
| JP | 2013-173968 A | 9/2013 |
| JP | 2013-209710 A | 10/2013 |
| JP | 2014-065928 A | 4/2014 |
| JP | 2014-121720 A | 7/2014 |
| JP | 2014-133938 A | 7/2014 |
| JP | 2014-205870 A | 10/2014 |
| JP | 2015-017308 A | 1/2015 |
| JP | 2015-175028 A | 10/2015 |
| JP | 2016-130348 A | 7/2016 |
| JP | 2016-204753 A | 12/2016 |
| JP | 2017-179591 A | 10/2017 |
| WO | WO 2015/053250 A1 | 4/2015 |
| WO | WO 2017/006821 A1 | 1/2017 |
| WO | WO 2017/138166 A1 | 8/2017 |

OTHER PUBLICATIONS

Office Action for related Japanese Application No. 2017-566-424 dated Mar. 2, 2018 and English Translation.

PCT International Search Report for related International Application No. PCT/JP2017/003409 dated Mar. 30, 2017.

* cited by examiner (a)

(b)

(a)

(b)

(a)

(b)

(a)

(b)

(a)

(b)

(a)

(b)

(a)

(b)

(a)   (b)

(a)

(b)

(c)

(d)

(e)

(a)

(b)

(c)

(d)

(e)

(a)

(b)

(c)

(d)

(e)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(a)

(b)

(c)

(d)

(a)

(b)

(c)

(d)

METHOD FOR PRODUCING DEPOSITION MASK, DEPOSITION MASK, AND METHOD FOR PRODUCING ORGANIC SEMICONDUCTOR DEVICE

TECHNICAL FIELD

The present invention relates to a method for manufacturing a vapor deposition mask, and particularly to a method for manufacturing a vapor deposition mask having a structure in which a resin layer and a metal layer are layered together. The present invention also relates to a vapor deposition mask, and a method for manufacturing an organic semiconductor device using a vapor deposition mask.

BACKGROUND ART

In recent years, organic EL (Electro Luminescence) display devices have been drawing public attention as a display of the next generation. With organic EL display devices that are currently mass-produced, the formation of an organic EL layer is primarily done by using a vacuum vapor deposition method.

Typically, a mask made of a metal (a metal mask) is used as the vapor deposition mask. However, with the increasing definition of organic EL display devices, it is becoming difficult to precisely form a vapor deposition pattern using a metal mask. This is because it is difficult with current metal processing techniques to precisely form small openings corresponding to a short pixel pitch (e.g., about 10 to 20 μm) in a metal plate (e.g., a thickness of about 100 μm) to be the metal mask.

In view of this, a vapor deposition mask (hereinafter referred to also as a "layered mask") having a structure in which a resin layer and a metal layer are layered together has been proposed in the art as a vapor deposition mask for forming a vapor deposition pattern with a high definition.

For example, Patent Document No. 1 discloses a layered mask including a resin film layered with a hold member, which is a metal magnetic member. A plurality of openings corresponding to an intended vapor deposition pattern are formed in the resin film. Slits whose size is larger than the openings of the resin film are formed in the hold member. The openings of the resin film are arranged in the slits. Therefore, when the layered mask of Patent Document No. 1 is used, the vapor deposition pattern is formed corresponding to the plurality of openings of the resin film. Even small openings can be formed with a high precision in a resin film that is thinner than an ordinary metal plate used for a metal mask.

When forming small openings as described above in the resin film, a laser ablation method is suitably used. Patent Document No. 1 describes a method in which a resin film placed on a support member (e.g., a glass substrate) is irradiated with a laser so as to form openings of an intended size.

FIGS. 28(a) to 28(d) are schematic cross-sectional views each illustrating a step of a conventional method for manufacturing a vapor deposition mask disclosed in Patent Document No. 1.

According to Patent Document No. 1, first, as shown in FIG. 28(a), a metal layer 82 having openings (slits) 85 therein is formed on a resin film 81, thereby obtaining a layered film 80. Then, as shown in FIG. 28(b), the layered film 80 is attached to a frame 87 with tension in a predetermined in-plane direction(s) applied on the layered film 80. Then, the layered film 80 is placed on a glass substrate 90 as shown in FIG. 28(c). In this process, a surface of the resin film 81 that is opposite from the metal layer 82 is brought into close contact with the glass substrate 90 with a liquid 88 such as ethanol therebetween. Then, as shown in FIG. 28(d), portions of the resin film 81 that is exposed through the slits 85 of the metal layer 82 are irradiated with a laser beam L, thereby forming a plurality of openings 89 in the resin film 81. Thus, a layered vapor deposition mask 900 is manufactured.

CITATION LIST

Patent Literature

Patent Document No. 1: Japanese Laid-Open Patent Publication No. 2014-205870

SUMMARY OF INVENTION

Technical Problem

However, with the conventional manufacturing method shown in FIG. 28, it may be difficult to process the resin film with a high precision, and burrs may occur at the peripheral edge of the openings of the resin film.

When a resin film has burrs, it is difficult to bring a finished vapor deposition mask into close contact with a substrate to be the vapor deposition object (hereinafter referred to also as a "vapor deposition substrate"), and there may be a gap between the vapor deposition mask and the vapor deposition substrate. Thus, when a conventional vapor deposition mask is used, there is a possibility that a vapor deposition pattern having a high definition corresponding to the openings of the vapor deposition mask is not obtained. The details will be described later.

Note that although attempts have been made to remove burrs by wiping, or the like, after a resin film is processed, no method has been proposed in the art that is capable of suppressing the occurrence of burrs itself.

The present invention has been made in view of the above, and an object thereof is to provide a layered vapor deposition mask that can suitably be used for forming a vapor deposition pattern having a high definition, and a method for manufacturing the same. Another object of the present invention is to provide a method for manufacturing an organic semiconductor device using such a vapor deposition mask.

Solution to Problem

A method for manufacturing a vapor deposition mask in one embodiment of the present invention is a method for manufacturing a vapor deposition mask including a resin layer, and a magnetic metal body formed on the resin layer, the method including the steps of: (A) providing a magnetic metal body having at least one first opening; (B) providing a substrate; (C) forming a resin layer by applying a solution including a resin material or a varnish of a resin material on a surface of the substrate, and then performing a heat treatment thereon; (D) securing the resin layer formed on the substrate on the magnetic metal body so as to cover the at least one first opening; (E) forming a plurality of second openings in the resin layer; and (F) after the step (E), removing the substrate from the resin layer.

In one embodiment, the step (E) is performed after the step (D); and the plurality of second openings are formed in a region of the resin layer that is located in the at least one first opening of the magnetic metal body.

In one embodiment, the step (E) is performed between the step (C) and the step (D).

In one embodiment, the method further includes the step of providing a frame along a peripheral edge portion of the magnetic metal body.

In one embodiment, in the step (C), the heat treatment is performed under such a condition that a tensile stress greater than 0.2 MPa is produced on the resin layer at room temperature in a layer in-plane direction.

In one embodiment, a width of the at least one first opening is 30 mm or more; and where δ denotes a maximum bend amount of a region of the resin layer that is located in the at least one first opening of the magnetic metal body when the magnetic metal body is held in a horizontal direction after the substrate is removed in the step (F), in the step (C), the heat treatment is performed under such a condition that a tensile stress such that the maximum bend amount δ is 5 μm or less is produced on the resin layer.

In one embodiment, where W denotes a minimum width of the at least one first opening, and where δ denotes a maximum bend amount of a region of the resin layer that is located in the at least one first opening of the magnetic metal body when the magnetic metal body is held in a horizontal direction after the substrate is removed in the step (F), in the step (C), the heat treatment is performed under such a condition that a tensile stress such that δ/W is 0.01% or less is applied on the resin layer.

In one embodiment, a compressive stress is applied on the magnetic metal body from the resin layer after the substrate is removed in the step (F).

In one embodiment, the resin layer is a polyimide layer, and the substrate is a glass substrate; and the heat treatment in the step (C) includes a step of heating the substrate with a solution including the resin material or a varnish of the resin material applied thereon to a temperature of 300° C. or more and 600° C. or less at a rate of 30° C./min or more.

In one embodiment, the step (D) includes the steps of: (D1) forming an adhesive layer on a portion of the resin layer; and (D2) attaching the resin layer to the magnetic metal body with the adhesive layer therebetween.

In one embodiment, the adhesive layer is a metal layer; and the step (D2) is a step of welding the metal layer to the magnetic metal body, thereby attaching the resin layer to the magnetic metal body with the metal layer therebetween.

In one embodiment, a width of the at least one first opening is 30 mm or more, and there is no magnetic metal on a region of the resin layer that is located in the at least one first opening of the magnetic metal body.

In one embodiment, the magnetic metal body has an open mask structure.

A vapor deposition mask in one embodiment of the present invention includes: a frame; a magnetic metal body supported on the frame and including at least one first opening; a resin layer arranged on the magnetic metal body so as to cover the at least one first opening; and an adhesive layer located between the resin layer and the magnetic metal body for attaching together the resin layer and the magnetic metal body, wherein: the resin layer has a tensile stress in a layer in-plane direction; and the magnetic metal body receives a compressive stress in an in-plane direction from the resin layer.

In one embodiment, the tensile stress of the resin layer at room temperature is greater than 0.2 MPa.

In one embodiment, the adhesive layer is a metal layer fixed on the resin layer, and the metal layer is welded to the magnetic metal body.

In one embodiment, a width of the at least one first opening is 30 mm or more; and a maximum bend amount δ of a region of the resin layer that is located in the at least one first opening of the magnetic metal body when the magnetic metal body is held in a horizontal direction is 5 μm or less.

In one embodiment, δ/W is 0.01% or less, where W denotes a width of the at least one first opening, and δ denotes a maximum bend amount of a region of the resin layer that is located in the at least one first opening of the magnetic metal body when the magnetic metal body is held in a horizontal direction.

In one embodiment, a width of the at least one first opening is 30 mm or more, and there is no magnetic metal on a region of the resin layer that is located in the at least one first opening of the magnetic metal body.

In one embodiment, the magnetic metal body has an open mask structure.

A method for manufacturing an organic semiconductor device in one embodiment of the present invention includes the step of vapor-depositing an organic semiconductor material on a work using any of the vapor deposition masks set forth above.

Advantageous Effects of Invention

An embodiment of the present invention provides a layered vapor deposition mask that can suitably be used for the formation of a vapor deposition pattern having a high definition, and a method for manufacturing the same.

DESCRIPTION OF EMBODIMENTS

With a conventional method for manufacturing a layered vapor deposition mask, burrs may be produced at the peripheral edge of the openings of the resin film, as described above. The present inventors conducted an in-depth study on how burrs are produced, arriving at the findings as follows.

Figure 27:
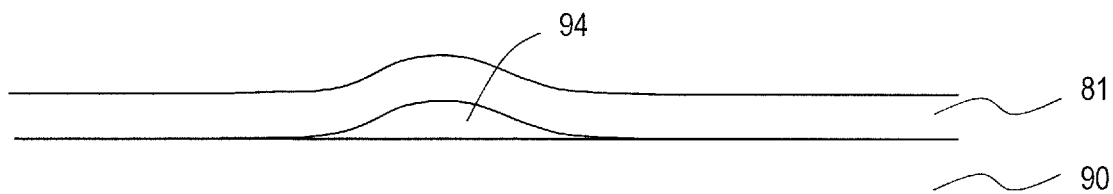
FIGS. 27(a) to 27(d) are schematic cross-sectional views illustrating how a burr is produced on a resin film with a laser ablation method.
Figure 27:
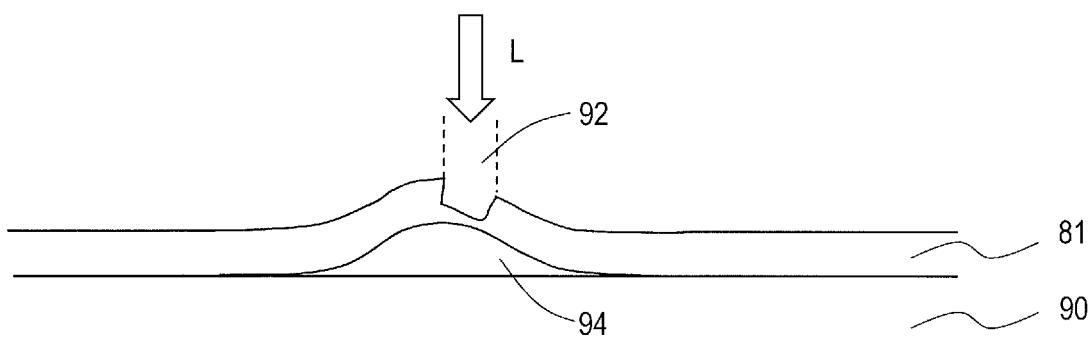
Figure 27:
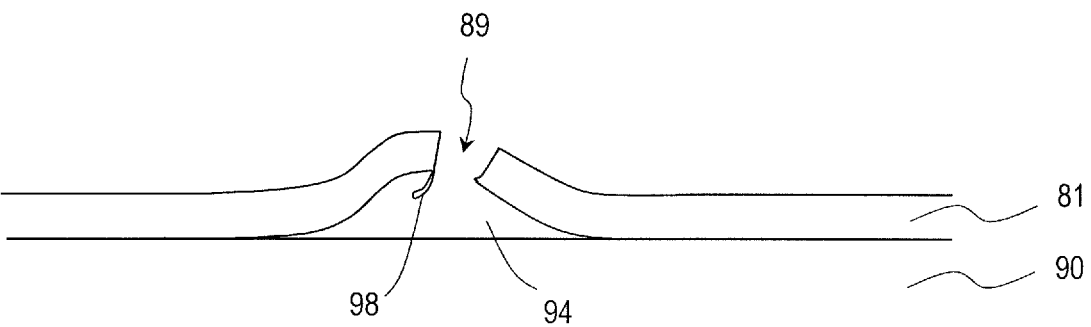
Figure 27:
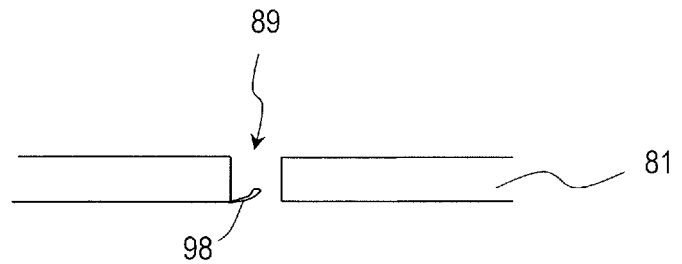
Figure 28:
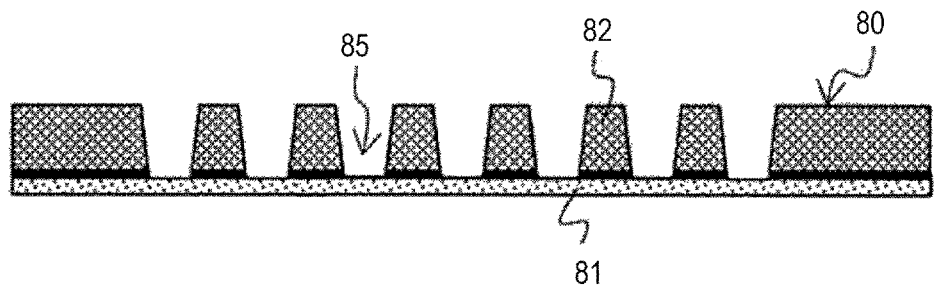
FIGS. 28(a) to 28(d) are schematic cross-sectional views each illustrating a step in a conventional method for manufacturing a vapor deposition mask disclosed in Patent Document No. 1.
Figure 28:
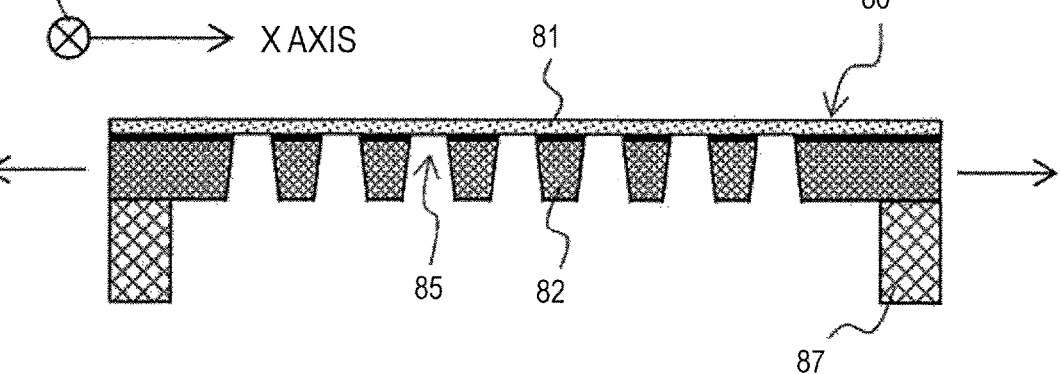
Figure 28:
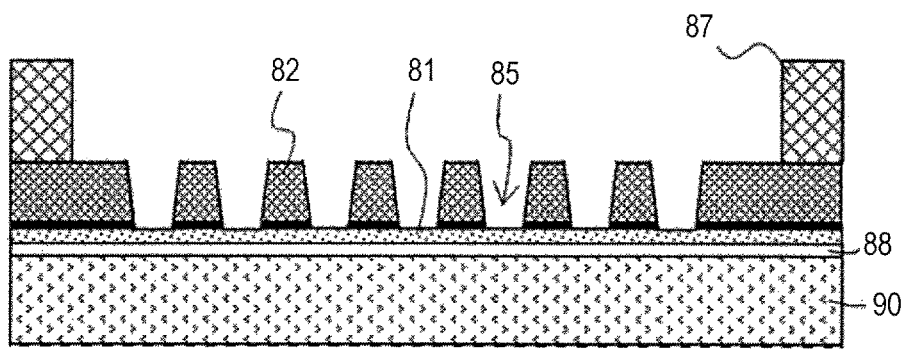
Figure 28:
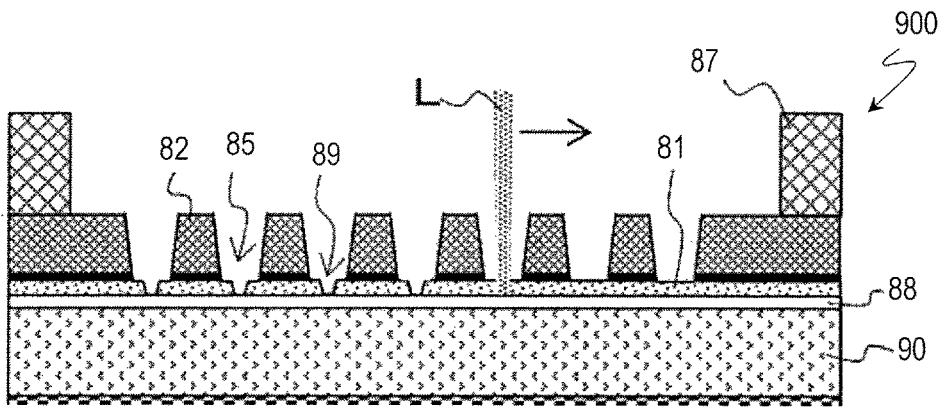

With the conventional method, as described above with reference to FIGS. 28(c) and 28(d), the openings 89 are formed by irradiating predetermined regions (hereinafter referred to as "laser irradiation regions") of the resin film 81 with the laser beam L while the resin film 81 is kept in close contact with the glass substrate 90 because of the surface tension of the liquid 88 such as ethanol. Based on a study by the present inventors, it was found that with this method, bubbles are produced partially at the interface between the glass substrate 90 and the resin film 81 when bringing the resin film 81 into close contact with the glass substrate 90, thereby locally lowering the adhesion. Moreover, the present inventors found that when there is a bubble under a certain laser irradiation region of the resin film 81, it does not only make it difficult to form the openings 89 with a high precision but it also makes it likely that a burr is produced in that laser irradiation region. This will be described in detail with reference to FIG. 27.

FIGS. 27(a) to 27(d) are schematic cross-sectional views illustrating how a burr is produced because of a bubble between the glass substrate 90 and the resin film 81. FIG. 27 does not show the metal layer and the liquid.

As shown in FIG. 27(a), when the resin film 81 is brought into close contact on a support member such as the glass substrate 90 (e.g., with a liquid therebetween), a gap (bubble) 94 may be produced partially between the glass substrate 90 and the resin film 81. When a process on the resin film 81 using a laser ablation method (hereinafter referred to also simply as "laser process") is performed in this state, a laser irradiation region 92 for forming an opening may be placed in a portion of the resin film 81 that is located over the bubble 94, as shown in FIG. 27(b). The laser irradiation region 92 is irradiated in a plurality of shots while focusing on the surface of the resin film 81, for example.

Laser ablation refers to a phenomenon in which when the surface of a solid is irradiated with a laser beam, a constituent substance on the solid surface rapidly radiates because of the energy of the laser beam. Herein, the speed of radiation is referred to as the ablation speed. In a laser process, there may be an ablation speed distribution depending on the energy distribution across the laser irradiation region 92 so that a through hole is formed first only in a portion of the resin film 81. Then, as shown in FIG. 27(c), another portion 98 of the resin film 81 that has been thinned is folded back onto the reverse side of the resin film 81 (i.e., into the bubble 94 between the resin film 81 and the glass substrate 90), and the portion 98 is no longer irradiated with the laser beam L. As a result, the opening 89 is formed with the thinned portion 98 remaining unremoved. In the present specification, the portion 98 of the resin film 81 that is thinned and left remaining is referred to as a "burr".

With the burr 98 projecting on the reverse side of the resin film 81, when the vapor deposition mask is placed on a vapor deposition substrate, a portion of the vapor deposition mask may be lifted off the vapor deposition substrate. Then, there is a possibility that a vapor deposition pattern that is shaped corresponding to the openings 89 may not be obtained.

Note that a process of removing the burr 98 of the resin film 81 (a burr removing step) may be performed after the laser process. For example, attempts have been made to wipe the reverse surface of the resin film 81, for example. However, it is difficult, by a burr removing step, to entirely remove the burr 98 on the resin film 81. As shown in FIG. 27(d), wiping may possibly move back some burrs 98 so as to protrude into the opening 89, thereby causing shadowing during a vapor deposition step.

Based on the findings described above, the present inventors found a novel method with which it is possible to form, with a high precision, openings of an intended size in a resin layer supported on a support member while suppressing the occurrence of burrs, thus arriving at the present invention.

An embodiment of the present invention will now be described with reference to the drawings. Note that the present invention is not limited to the following embodiment.

Embodiment

<Structure of Vapor Deposition Mask>

Figure 1:
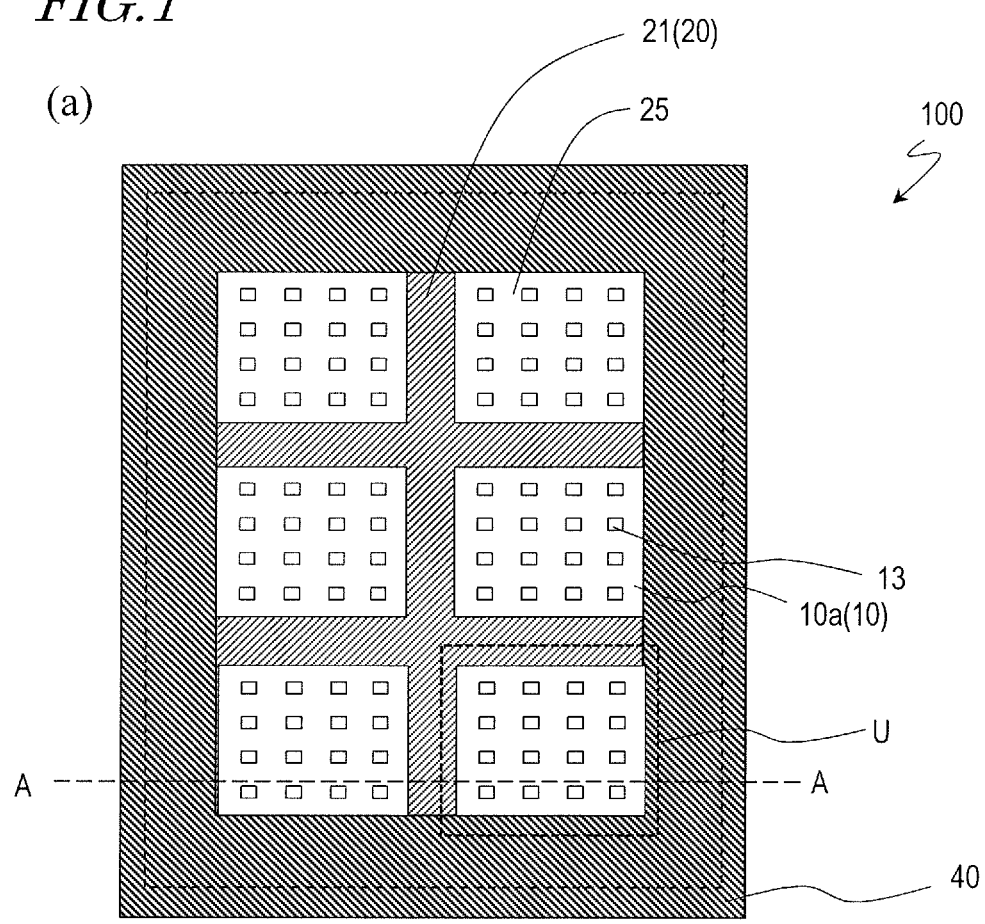
FIG. 1(a) is a plan view schematically showing a vapor deposition mask 100 according to an embodiment of the present invention.
FIG. 1(b) is a cross-sectional view taken along line A-A of FIG. 1(a).
Figure 1:
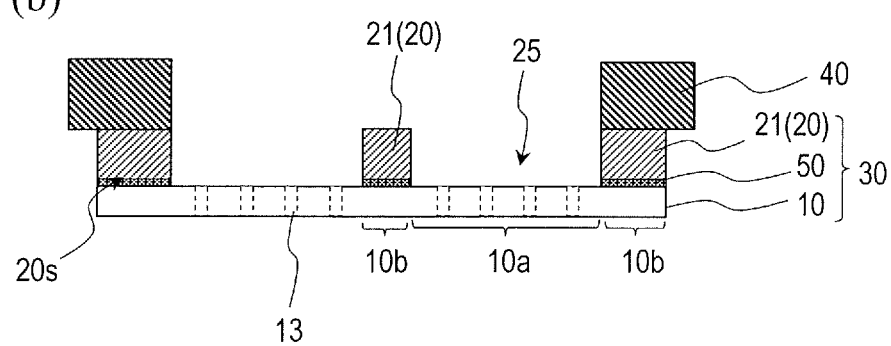

Referring to FIGS. 1(a) and 1(b), a vapor deposition mask 100 according to an embodiment of the present invention will be described. FIGS. 1(a) and 1(b) are a plan view and a cross-sectional view, respectively, schematically showing the vapor deposition mask 100. FIG. 1(b) shows a cross section taken along line A-A of FIG. 1(a). Note that FIG. 1 schematically shows an example of the vapor deposition mask 100, and it is needless to say that the size, number, arrangement, length ratio, etc., of the various components are not limited to those shown in the figure. This similarly applies also to other figures to be referred to below.

As shown in FIGS. 1(a) and 1(b), the vapor deposition mask 100 includes a magnetic metal body 20, a resin layer 10 arranged on a primary surface 20s of the magnetic metal body 20. It may further include an adhesive layer 50 located at least partially between the resin layer 10 and the magnetic metal body 20. The adhesive layer 50 is a layer that bonds together the resin layer 10 and the magnetic metal body 20.

The vapor deposition mask 100 is a layered mask having a structure in which the resin layer 10 and the magnetic metal body 20 are layered together. Hereinafter, a layered member 30 including the resin layer 10 and the magnetic metal body 20 may be referred to as a "mask member".

A frame 40 may be provided along the peripheral edge portion of the mask member 30. The frame 40 may be attached to a surface of the magnetic metal body 20 that is opposite from the primary surface 20s.

The magnetic metal body 20 includes at least one opening (hereinafter referred to as a "first opening") 25. In this example, the magnetic metal body 20 has six first openings 25. A portion 21 of the magnetic metal body 20 located around the first openings 25 and where a metal exists (including a portion between adjacent first openings 25) is referred to as a "solid portion".

The magnetic metal body 20 may have an open mask structure. An "open mask structure" refers to a structure in which a vapor deposition mask used for forming a plurality of devices (e.g., organic EL displays) on one vapor deposition substrate, wherein the vapor deposition mask has one opening for a unit region U that corresponds to one device. Note that the magnetic metal body 20 does not need to have an open mask structure, and may have a structure in which two or more openings (e.g., slits) are arranged for one unit region U, for example. Hereinafter, a magnetic metal body having an open mask structure may be referred to simply as an "open mask".

As will be described later, when performing a vapor deposition step using the vapor deposition mask 100, the vapor deposition mask 100 is arranged so that the magnetic metal body 20 is located on the vapor deposition source side and the resin layer 10 on the work (vapor deposition object) side. Since the magnetic metal body 20 is a magnetic member, the vapor deposition mask 100 can be easily held and secured on the work in the vapor deposition step by using a magnetic chuck.

The resin layer 10 is arranged on the primary surface 20s of the magnetic metal body 20 so as to cover the first openings 25. A region 10a of the resin layer 10 that is located in the first opening 25 is referred to as the "first region", and a region 10b thereof that overlaps a solid portion 21 of the magnetic metal body 20 as seen from a direction normal to the vapor deposition mask 100 is referred to as the "second region".

A plurality of openings (hereinafter "second openings") 13 are formed in the first region 10a of the resin layer 10. The plurality of second openings 13 are formed with a size, shape and position corresponding to the vapor deposition pattern to be formed on the work. In this example, a plurality of second openings 13 are arranged in an array with a predetermined pitch in each unit region U. The interval between two adjacent unit regions U is typically larger than the interval between two adjacent second openings 13 in a unit region U. In this example, there is no magnetic metal on the first region 10a.

The second region 10b of the resin layer 10 is attached to the area around the first opening 25 of the magnetic metal body 20 (the solid portion 21) with the adhesive layer 50 therebetween. There is no particular limitation on the adhesive layer 50, but the adhesive layer 50 may be a metal layer. For example, the resin layer 10 may be attached to the magnetic metal body 20 by forming a metal layer, by plating, or the like, on the second region 10b of the resin layer 10, and welding together the metal layer and the solid portion 21 of the magnetic metal body 20. Alternatively, the adhesive layer 50 may be formed from an adhesive. Note that it is only required that the resin layer 10 be attached to the magnetic metal body 20 by the method shown above, and it may not be attached directly to the frame 40.

As will be described later, the resin layer 10 is a layer that is formed by applying a solution including a resin material (e.g., a soluble-type polyimide solution) or a solution including a precursor of a resin material (e.g., a polyimide varnish) on a support substrate such as a glass substrate, and performing a heat treatment thereon. The heat treatment, as used herein, includes a heat treatment for performing a baking step (e.g., 100° C. or more) when a soluble-type polyimide solution is used, and a heat treatment for performing a baking and curing step (e.g., 300° C. or more) when a polyimide varnish is used.

In the present embodiment, the plurality of second openings 13 are formed by performing a laser process on the resin layer 10 on the support substrate. The support substrate and the resin layer 10 are in close contact with each other with no (or little) bubble therebetween, thereby suppressing the occurrence of burrs in the laser process step on the resin layer 10. Thus, the resin layer 10 of the present embodiment substantially has no burrs. Even when the resin layer 10 has burrs, the number of burrs (per unit area) is substantially lower as compared with conventional methods. The support substrate is removed from the resin layer 10 after the second openings 13 are formed in the resin layer.

The resin layer 10 formed on the support substrate by the method described above may have a tensile stress (internal stress of tension) in the layer in-plane direction. Therefore, since it is possible to reduce the bend occurring in the first region 10a of the resin layer 10 after removing from the support substrate, it is possible to form a vapor deposition pattern having a high definition on the work. The tensile stress of the resin layer 10 can be controlled by the heat treatment condition, or the like, used when forming the resin layer 10 on the support substrate, for example. The tensile stress of the resin layer 10 is greater than 0.2 MPa, for example, at room temperature. It is preferably 3 MPa or more. Then, it is possible to more effectively reduce the bend.

Typically, when forming a resin film on the support substrate by a heat treatment, the heat treatment is performed under such conditions that the residual stress on the resin film can be reduced as much as possible. This is because an increase in the residual stress (tensile stress) on the resin film will cause problems such as warping of the support substrate, thereby lowering the shape stability and the reliability. In contrast, the present embodiment intentionally causes a predetermined tensile stress on the resin layer 10, thereby reducing the bend of the resin layer 10. This eliminates the need for a step of stretching the resin layer 10, and it is possible to manufacture a vapor deposition mask with a reduced bend by an easier process.

Note that the resin layer 10 being on the support substrate may have a stress distribution, but once the support substrate is removed, the magnitude of tensile stress on the resin layer 10 can be leveled to be substantially uniform across the surface. Thus, a tensile stress of a substantially constant magnitude can be realized across the first region 10a of the resin layer 10.

According to the present embodiment, since the resin layer 10 has a predetermined tensile stress, it is possible to reduce the bend occurring in the resin layer 10 without arranging a metal film close to the second openings 13 of the resin layer 10. This eliminates the need for a patterning step of precisely patterning a metal film. Moreover, it is possible to increase the size of the first opening 25 of the magnetic metal body 20 while suppressing the occurrence of a bend, and it is possible to use the magnetic metal body 20 having an open mask structure, for example. This will be described in detail below.

With conventional vapor deposition masks, a layered film of a resin film and a metal film (a magnetic metal film) (or a resin film) was secured on a frame while being stretched in a particular layer in-plane direction by means of a stretcher, or the like (hereinafter referred to as a "stretching step"). With such a layered mask, if the opening of the metal film was too large, it was possible that the resin film bent by virtue of its own weight, and a vapor deposition pattern shaped corresponding to the openings of the resin film might not be obtained. In view of this, with conventional methods, it was necessary to form a precise metal pattern on a resin film, as proposed in Patent Document No. 1, so as to arrange a metal film, which is a hold member, as close as possible to the openings of the resin film. In contrast, according to the present embodiment, an intended tensile stress can be caused on the resin layer 10 based on the process conditions when forming the resin layer 10 on the support substrate. Since a tensile stress is caused on the resin layer 10, separately from the magnetic metal body 20, it is possible to more easily control the magnitude of the tensile stress on the resin layer 10. Therefore, there is no need to form a magnetic metal film having a precise pattern on a resin film, and it is possible to use a metal plate pre-formed with first openings therein such as an open mask. Therefore, it is possible to significantly reduce the manufacturing process and the manufacturing cost as compared with conventional methods.

The present embodiment is particularly advantageous when using a magnetic metal body 20 having first openings 25 of a relatively large size therein, such as an open mask, for example. Even when the size of the first openings 25 is relatively large, it is possible to reduce the bend occurring in the resin layer 10 because of the internal tensile stress of the resin layer 10. Therefore, there is no need to separately arrange a magnetic metal on the first region 10a of the resin layer 10 so as to suppress misalignment of a vapor deposition pattern due to a bend. The width (the dimension along the width direction) of the first opening 25 may be 30 mm or more, or 50 mm or more, for example. While there is no particular limitation on the upper limit of the width of the first opening 25, it is possible to suppress an increase in the bend amount when it is 300 mm or less, for example.

According to the present embodiment, it is possible to suppress the maximum bend amount $\delta$ of the resin layer 10 to be less than or equal to a predetermined value $\delta s$. Herein, the maximum bend amount $\delta$ of the resin layer 10 refers to the maximum bend amount of the first region 10a of the resin layer 10 when the magnetic metal body 20 is held in the horizontal direction. While there is no particular limitation on $\delta s$, it is 5 μm, preferably 2 μm, for example. For example, when the width of the first opening 25 of the magnetic metal body 20 is 30 mm or more, the maximum bend amount $\delta$ of the resin layer 10 may be 5 μm or less. Or, $\delta/W$ may be 0.01% or less, where W denotes the width of the first opening 25, and $\delta$ denotes the maximum bend amount of the resin layer 10.

With the vapor deposition mask 100 of the present embodiment, the magnetic metal body 20 receives a compressive stress in an in-plane direction from the resin layer 10. Note that when a layered film is secured on a frame by a stretching step, the metal film and the resin film both receive tension in a layer plane direction(s) from the frame, and a configuration in which the resin film gives a compressive stress on the metal film is not obtained. Also when only the resin film is secured on the frame by a stretching step, the resin film is not kept in close contact with the metal film, and it is believed that the metal film does not receive a compressive stress from the resin film.

For example, polyimide can suitably be used as the material of the resin layer 10. Polyimide is desirable in terms of strength, chemical resistance and heat resistance. Other resin materials such as polyparaxylene, bismaleimide and silica hybrid polyimide may be used as the material of the resin layer 10. The linear thermal expansion coefficient $\alpha R$ (ppm/° C.) of the resin film of the resin layer 10 is preferably generally equal to the linear thermal expansion coefficient of the substrate, which is the vapor deposition object. Such a resin layer 10 can be formed based on the formation conditions, etc., such as the resin material and the curing conditions. The method for forming the resin layer 10 will be described later.

There is no particular limitation on the thickness of the resin layer 10. Note however that if the resin layer 10 is too thick, portions of the vapor deposition film may be thinner than an intended thickness (this is called "shadowing"). In order to suppress the occurrence of shadowing, the thickness of the resin layer 10 is preferably 25 μm or less. When it is 3 μm or more, it is possible to form a resin layer 10 having a more uniform thickness by performing a heat treatment on a solution including a resin material (or a precursor thereof) applied on the support substrate. Also in view of the strength and the cleaning tolerance of the resin layer 10 itself, it is preferred that the thickness of the resin layer 10 is 3 μm or more.

Various magnetic metal materials can be used as the material of the magnetic metal body 20. Materials having a relatively large linear thermal expansion coefficient $\alpha M$ such as Ni, Cr, ferritic stainless steel and martensitic stainless steel, for example, may be used, or materials having a relatively small linear thermal expansion coefficient αM such as an Fe—Ni-based alloy (invar) or an Fe—Ni—Co-based alloy, for example, may be used.

Note that conventional vapor deposition masks such as that disclosed in Patent Document No. 1 are designed so that the size of slits of the metal layer is as small as possible, and the area ratio of the solid portion with respect to the entire mask is relatively high (over 70% in FIG. 1 of Patent Document No. 1). Therefore, a material having a small linear thermal expansion coefficient αM (e.g., αM: less than 6 ppm/° C.) was used as the material of the metal layer. This is to ensure the shape stability of the vapor deposition mask in the vapor deposition step. In contrast, with the present embodiment, the area ratio of the solid portion 21 with respect to the entire mask can be made small (i.e., the area ratio of the first openings 25 can be made large), and it is therefore possible to use a metal having a high linear thermal expansion coefficient that cannot be used with conventional methods. Therefore, various metal materials can be used, irrespective of their linear thermal expansion coefficient, thus increasing the degree of freedom in selecting a metal material.

There is no particular limitation on the thickness of the magnetic metal body 20. Note however that when the magnetic metal body 20 is too thin, the attraction force received for the magnetic field of the magnetic chuck will decrease, and it will be difficult to hold the vapor deposition mask 100 on the work in the vapor deposition step. Therefore, it is preferred that the thickness of the magnetic metal body 20 is 5 μm or more.

It is preferred that the thickness of the magnetic metal body 20 is set within such a range that no shadowing occurs in the vapor deposition step. With conventional vapor deposition masks, a metal layer, which is a hold member, was arranged close to the openings of the resin film. Therefore, the thickness of the metal layer needed to be small (e.g., 20 μm or less) in order to suppress shadowing in the vapor deposition step. In contrast, according to the present embodiment, the resin layer 10 has a predetermined tensile stress, and there is no need to arrange the magnetic metal body 20 close to the second openings 13 of the resin layer 10. Therefore, the edge portion of the first opening 25 of the magnetic metal body 20 can be arranged sufficiently apart from the second openings 13 of the resin layer 10 (e.g., the minimum distance Dmin between the solid portion 21 of the magnetic metal body 20 and the second openings 13 is 1 mm or more). When the minimum distance Dmin is large, shadowing is unlikely to occur even if the magnetic metal body 20 is made thicker, thereby allowing the magnetic metal body 20 to be made thicker as compared with conventional methods. The thickness of the magnetic metal body 20 may be 1000 μm or more, for example, although it also depends on the vapor deposition angle, the taper angle of the magnetic metal body 20, and the minimum distance Dmin between the solid portion 21 of the magnetic metal body 20 and the second openings 13. When an open mask is used as the magnetic metal body 20, the thickness of the open mask can be set to 300 μm or more, for example, by designing the open mask so that the size of the first opening 25 is sufficiently larger than the unit region U. While there is no particular limitation on the upper limit value of the thickness of the magnetic metal body 20, it is possible to suppress shadowing if it is 1.5 mm or less, for example. Thus, according to the present embodiment, it is possible to increase the degree of freedom in selecting the thickness, as well as the material of the magnetic metal body 20.

The frame 40 is formed from a magnetic metal, for example. Alternatively, it may be formed from a non-metal material, e.g., a resin (plastic). With conventional vapor deposition masks, the frame was required to have an adequate rigidity so that the frame would not be deformed or broken by the tension from the layered film (a resin film and a metal film) secured on the frame due to the stretching step. Therefore, a frame made of an invar having a thickness of 20 mm, for example, was used. In contrast, according to the present embodiment, since the frame 40 is attached without performing the stretching step or without applying a large tension on the magnetic metal body 20, there is no tension on the frame 40 due to the stretching step. Therefore, it is possible to use a frame 40 having a lower rigidity as compared with conventional methods, increasing the degree of freedom in selecting the material of the frame 40. It is also possible to make the frame 40 thinner as compared with conventional methods. Using a frame that is thinner as compared with conventional methods or using a frame made of a resin, it is possible to obtain the vapor deposition mask 100 that has a light weight and a good handling property.

<Other Structure Examples of Vapor Deposition Mask>

FIGS. 2(a) and 2(b) are plan views schematically showing other vapor deposition masks 200 and 300 of the present embodiment. In these figures, like components to those of FIG. 1 are denoted by like reference signs. In the following description, only differences from the vapor deposition mask 100 will be described.

With the vapor deposition masks 200 and 300, the magnetic metal body 20 includes a plurality of first openings 25 in the unit region U. Two or more second openings 13 are located in each first opening 25 (needless to say, the present invention is not limited to the number of second openings shown in the figure).

As shown in FIG. 2(a), the first openings 25 may be slits arranged in the unit region U, wherein a slit is arranged for each column (or row) of second openings 13, which are arranged in an array extending in the row direction and the column direction. Alternatively, as shown in FIG. 2(b), one first opening 25 may be arranged for each sub-area that includes a plurality of columns and a plurality of rows of second openings 13.

Figure 2:
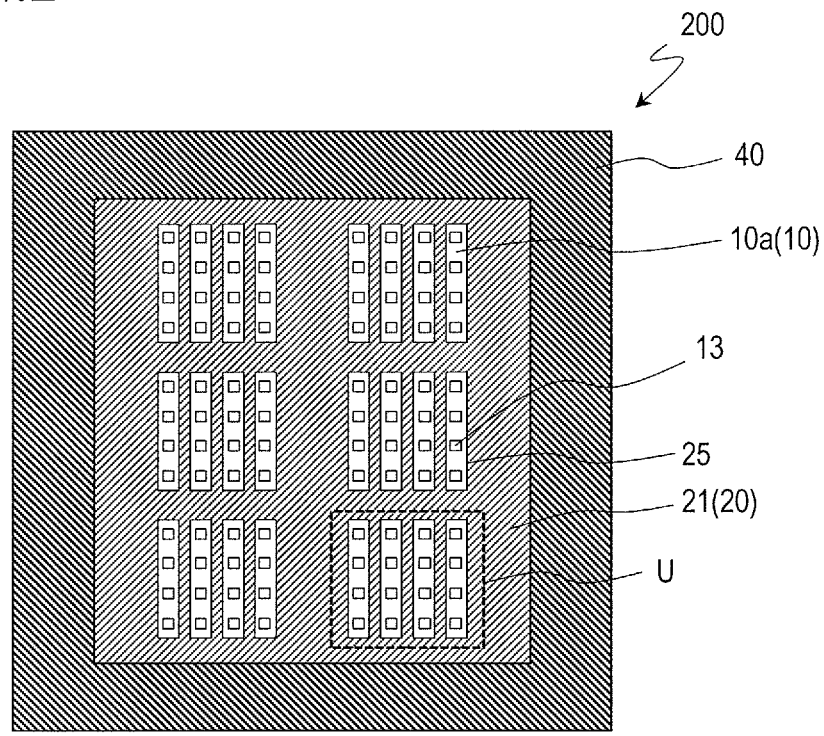
FIGS. 2(a) and 2(b) are plan views schematically showing another vapor deposition mask according to an embodiment of the present invention.
Figure 2:
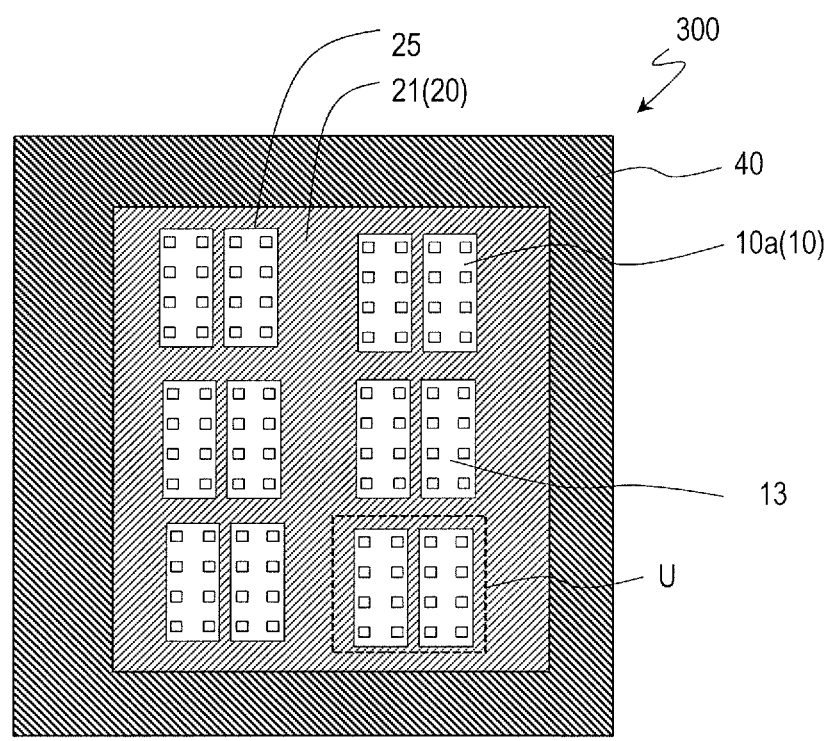
Figure 3:
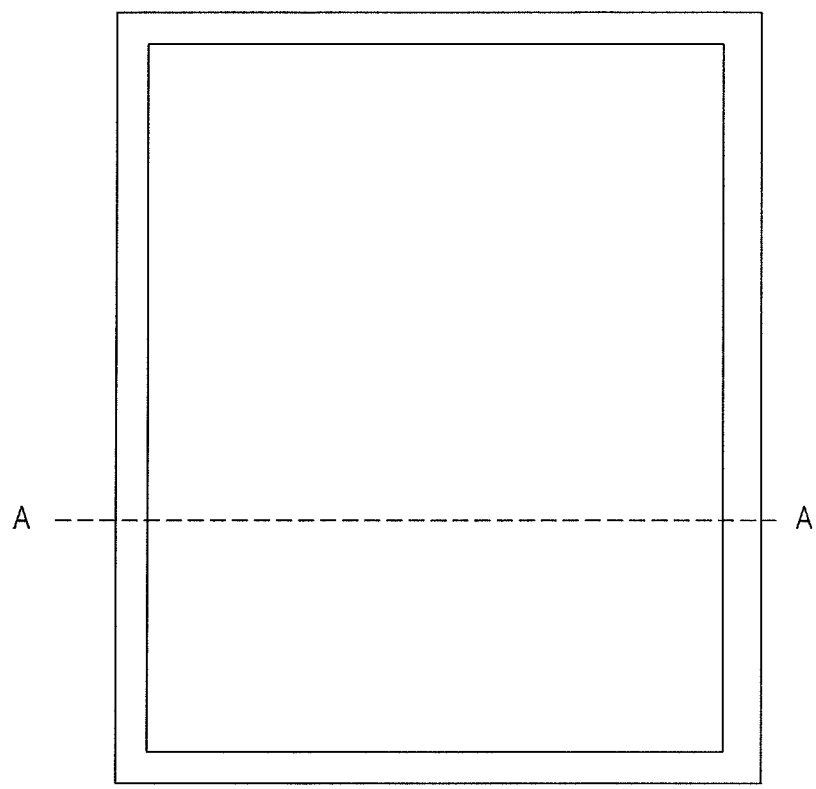
FIGS. 3(a) and 3(b) are a plan view and a cross-sectional view, respectively, illustrating a step of a method for manufacturing a vapor deposition mask according to an embodiment of the present invention.
Figure 3:
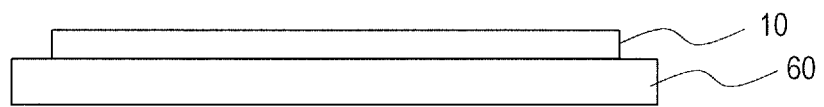
Figure 4:
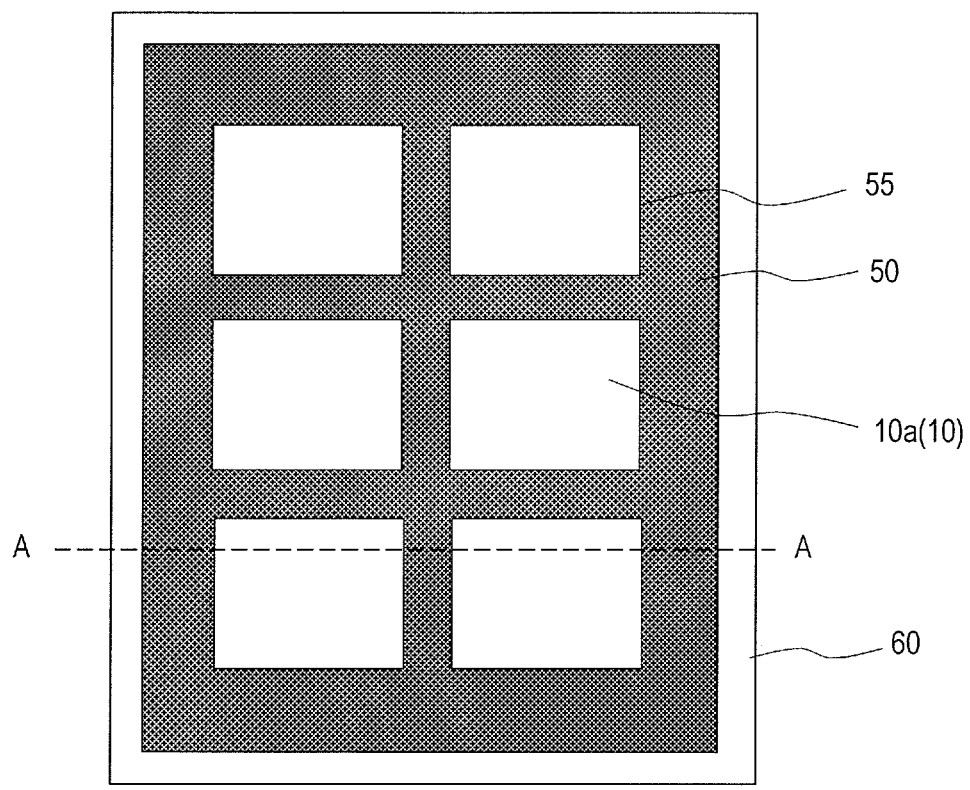
FIGS. 4(a) and 4(b) are a plan view and a cross-sectional view, respectively, illustrating a step of a method for manufacturing a vapor deposition mask according to an embodiment of the present invention.
Figure 4:
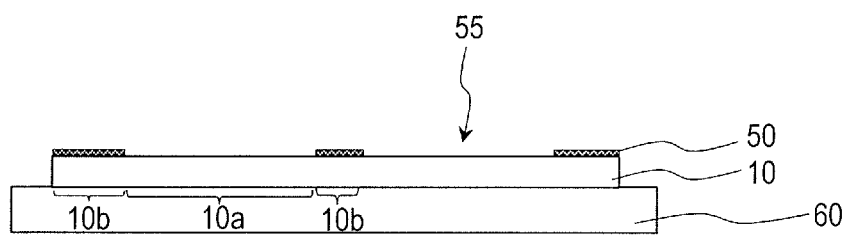
Figure 5:
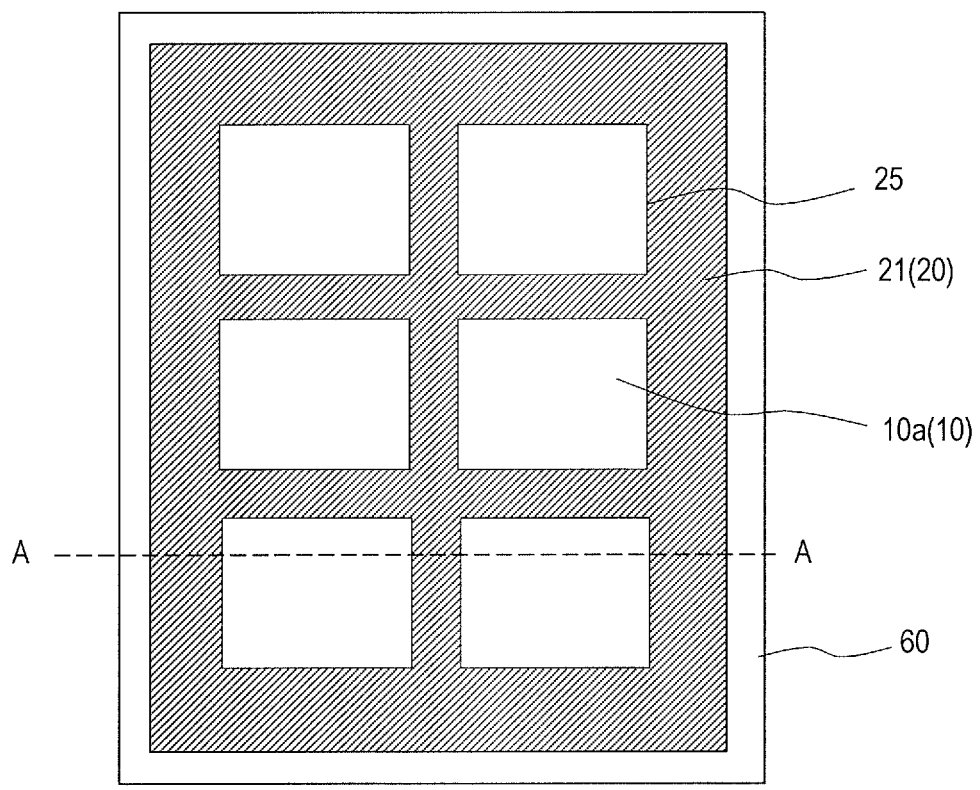
FIGS. 5(a) and 5(b) are a plan view and a cross-sectional view, respectively, illustrating a step of a method for manufacturing a vapor deposition mask according to an embodiment of the present invention.
Figure 5:
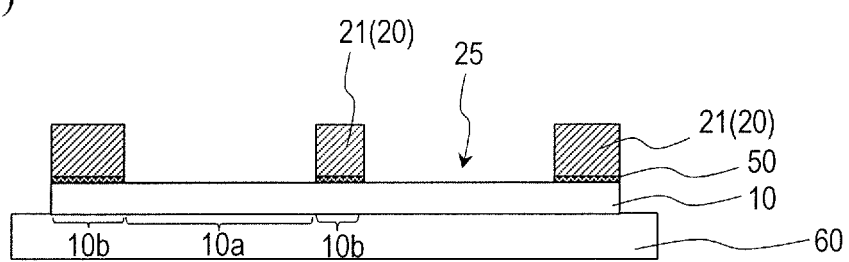
Figure 6:
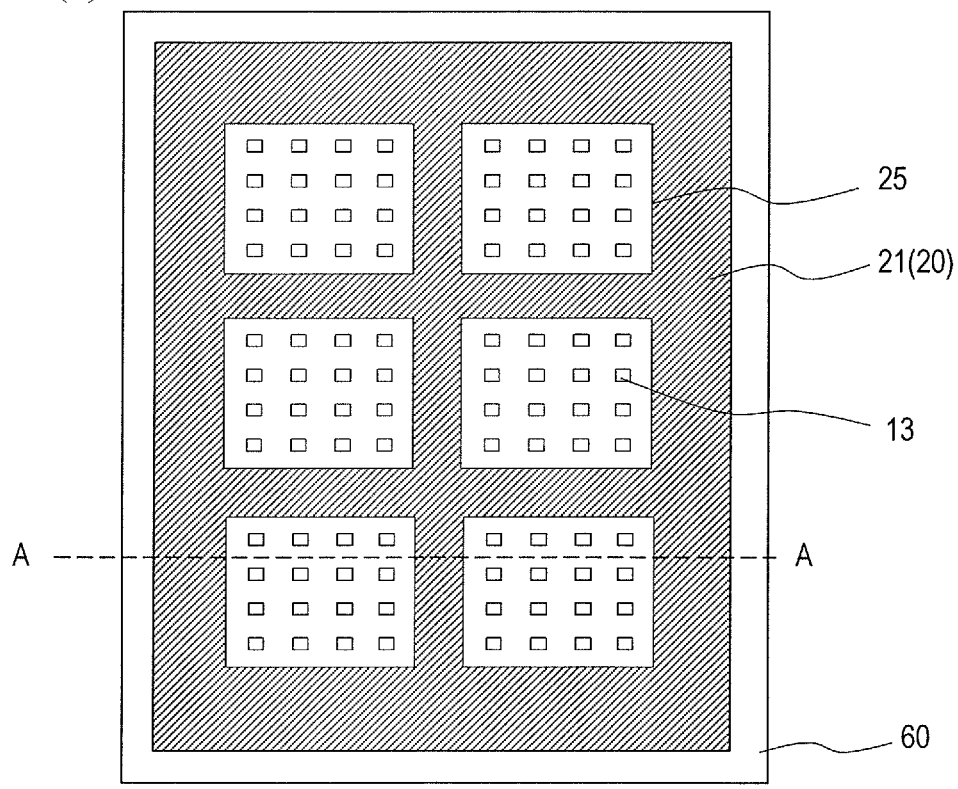
FIGS. 6(a) and 6(b) are a plan view and a cross-sectional view, respectively, illustrating a step of a method for manufacturing a vapor deposition mask according to an embodiment of the present invention.
Figure 6:
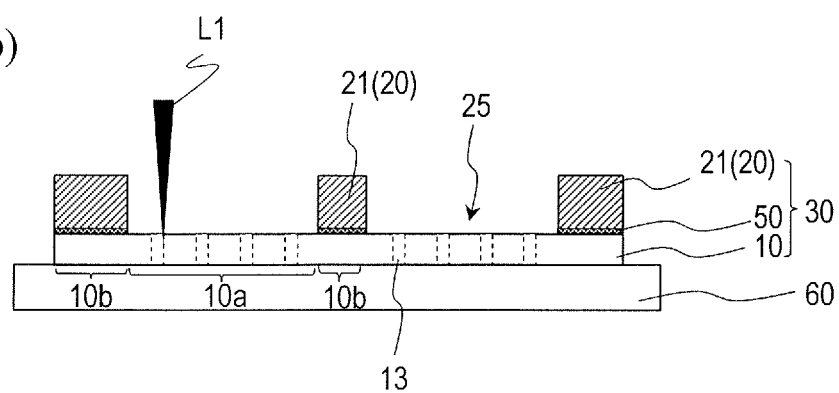
Figure 7:
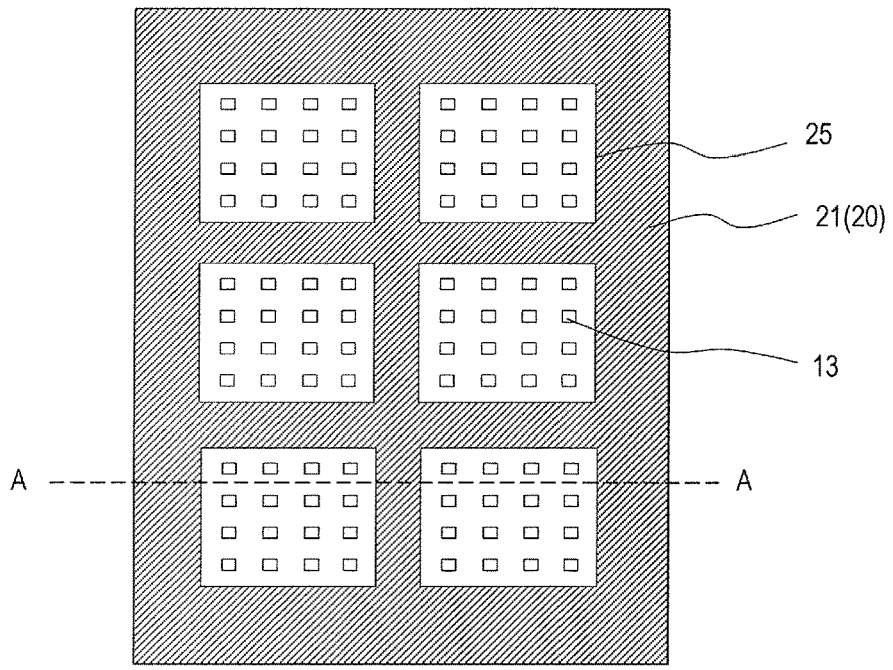
FIGS. 7(a) and 7(b) are a plan view and a cross-sectional view, respectively, illustrating a step of a method for manufacturing a vapor deposition mask according to an embodiment of the present invention.
Figure 7:
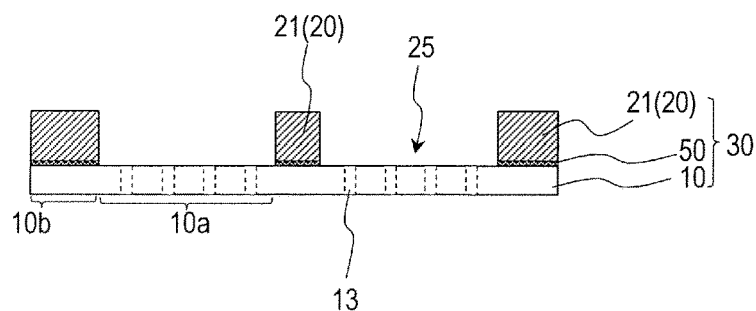

Note that while FIG. 1 and FIG. 2 illustrate vapor deposition masks having a plurality of unit regions U, the number of unit regions U and the arrangement method therefor, the number of second openings 13 and the arrangement method therefor in each unit region U are not limited to the examples shown in the figures but are determined based on the configuration of the device to be manufactured. The number of unit regions U may be singular.

<Method for Manufacturing Vapor Deposition Mask>

Referring to FIG. 3 to FIG. 7, a method for manufacturing a vapor deposition mask of the present embodiment will be described using, as an example, a method for manufacturing the vapor deposition mask 100. In FIG. 3 to FIG. 7, (a) and (b) are a plan view showing a step in an example of a method for manufacturing the vapor deposition mask 100, and a cross-sectional view showing a step thereof taken along line A-A shown in (a).

First, as shown in FIGS. 3(a) and 3(b), a support substrate 60 is provided, and the resin layer 10 is formed on the support substrate 60. For example, a glass substrate can suitably be used as the support substrate 60. There is no particular limitation on the size and thickness of the glass substrate.

The resin layer 10 is formed as follows. First, a solution (e.g., a polyimide varnish) including a precursor of a resin material or a solution (e.g., a soluble-type polyimide solution) including a resin material is applied on the support substrate 60. The method for applying a solution may be a method known in the art such as a spin coating method or a slit coater method. Herein, polyimide is used as the resin material, and a solution (a polyimide varnish) including polyamic acid, which is a precursor of polyimide, is applied on the support substrate 60 by a spin coating method. Then, a heat treatment (baking and curing) is performed to from a polyimide layer as the resin layer 10. The heat treatment temperature can be set to 300° C. or more, e.g., 400° C. or more and 500° C. or less.

The heat treatment conditions are set so that a predetermined tensile stress is produced in the resin layer 10. For example, the conditions may be set so that a tensile stress greater than 0.2 MPa (preferably, 3 MPa or more) is produced. The magnitude of tensile stress may vary depending on the thickness, shape and size of the support substrate 60, and the material properties (the Young's modulus, the Poisson's ratio, the thermal expansion coefficient, etc.) of the support substrate 60, as well as the material of the resin layer 10 and the heat treatment conditions. The heat treatment conditions as used herein include the heat treatment temperature (highest temperature), the heating speed, the hold time at a high temperature (e.g., 300° C. or more), the atmosphere during the heat treatment, etc. The heat treatment conditions also include not only the temperature profile when heating but also the temperature profile when cooling.

In order to leave a high tensile stress remaining in the resin layer 10, conditions may be set such that the polyimide varnish is caused to imidize rapidly, for example. As an example, it is possible to increase the tensile stress by increasing the heating speed. For example, when forming a polyimide layer on a glass substrate by a heat treatment, the glass substrate on which a polyimide varnish is applied may be heated to a temperature of 300° C. or more and 600° C. or less at a rate of 30'C/min or more. By setting the total amount of time for which the glass substrate is held at a temperature of 300° C. or more, for example, through the entire heat treatment step including heating and cooling to a short amount of time (e.g., within 30 min), it is possible to increase the tensile stress to remain in the resin layer 10. Moreover, it is possible to increase the tensile stress also by setting the total heat treatment time including heating and cooling to a relatively short amount of time (e.g., within one hour), setting the hold time at the highest temperature (standing time) to a short amount of time (e.g., within 5 min), and rapidly cooling after reaching the highest temperature, for example. There is no particular limitation on the heat treatment atmosphere, and it may be an air atmosphere or a nitrogen gas atmosphere. If a heat treatment is performed under a depressurized atmosphere at 100 Pa or less, it is possible to more easily increase the heating speed.

Instead of a polyimide varnish, a solution including a solvent-soluble polyimide (polymer) (a soluble-type polyimide solution) may be applied on the support substrate 60 and baked to form the resin layer 10. While there is no particular limitation on the baking temperature, which may be appropriately selected based on the boiling point of the solvent, it is 100° C. to 320° C., and preferably 120° C. to 250° C., for example. Also in such a case, it is possible to increase the tensile stress to remain in the resin layer 10 by increasing the heating speed to be generally equal to that described above, and shortening the hold time at a high temperature.

When the resin layer 10 is formed on the support substrate 60, the support substrate 60 may be warped depending on the material and thickness of the support substrate 60. On the support substrate 60, the resin layer 10 has a stress distribution. For example, the tensile stress increases from the central portion toward the edge portion of the resin layer 10. A greater tensile stress can possibly occur in the direction in which the support substrate 60 is longer.

Figure 8:
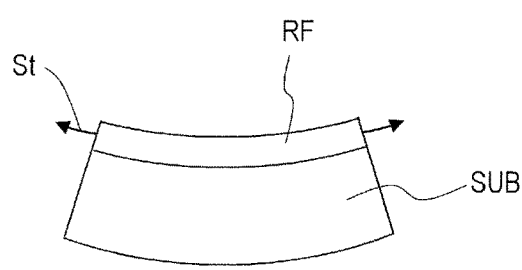
FIGS. 8(a) and 8(b) are diagrams each schematically showing the relationship between the stress caused by a film formed on a substrate and the deformation of the substrate.
Figure 8:
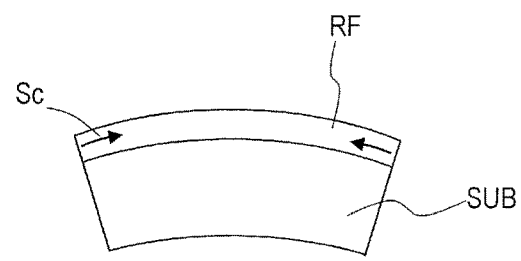
Figure 9:
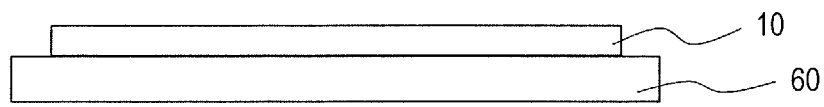
FIGS. 9(a) to 9(e) are cross-sectional views each showing a step of another method for manufacturing a vapor deposition mask according to an embodiment of the present invention.
Figure 9:
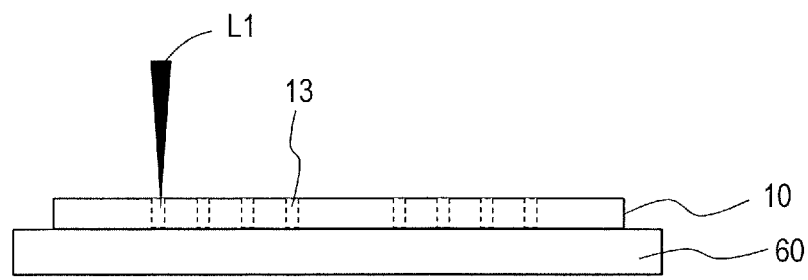
Figure 9:
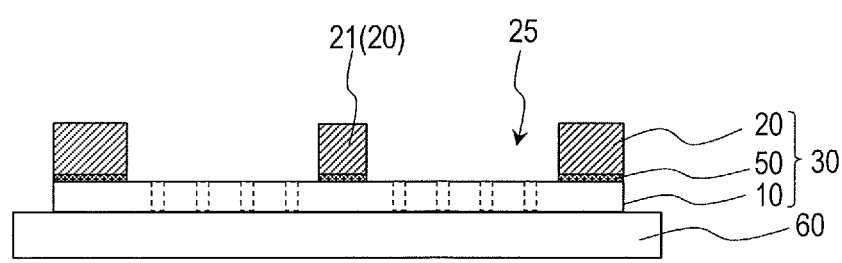
Figure 9:
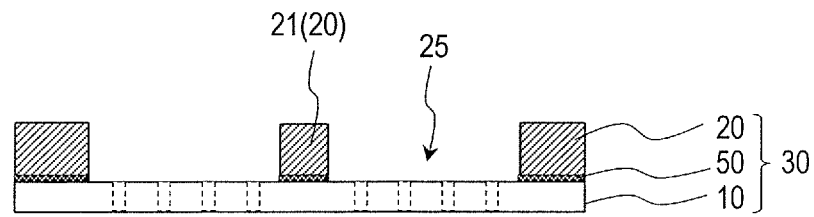
Figure 9:
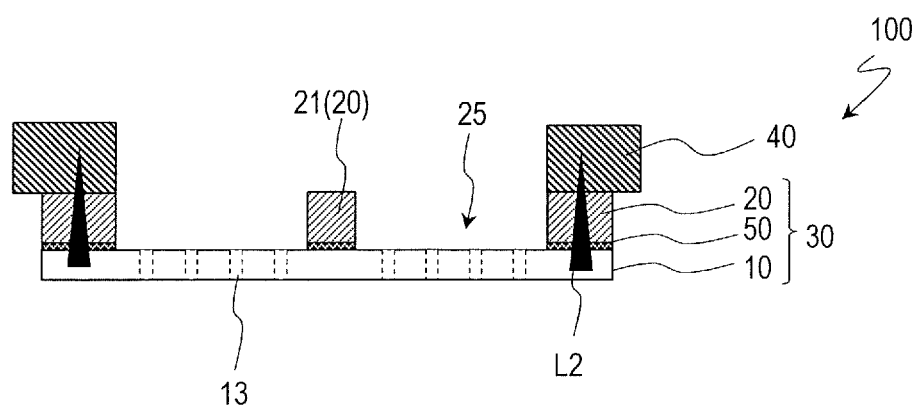

Now, referring to FIG. 8(a) and FIG. 8(b), the relationship between the stress from a film RF formed on a substrate SUB and the deformation of the substrate SUB. As schematically shown in FIG. 8(a), if the film RF has a tensile stress St, a compressive stress acts on the surface of the substrate SUB, and the surface of the substrate SUB deforms (warps) so as to form a concave surface. In contrast, as shown in FIG. 8(b), if the film RF has a compressive stress Sc, a tensile stress acts on the surface of the substrate SUB, and the surface of the substrate SUB deforms so as to form a convex surface.

Since the resin layer 10 formed by the method described above has a tensile stress, the support substrate 60 deforms so as to form a concave surface as shown in FIG. 8(a), and the edge portion of the support substrate 60 may rise off the horizontal surface. Note that depending on the material and thickness of the support substrate 60, the support substrate 60 may not warp even if a compressive stress is applied thereto from the resin layer 10.

Then, as shown in FIGS. 4(a) and 4(b), the adhesive layer 50 is formed on a portion of the resin layer 10. The adhesive layer 50 has openings 55 corresponding to the first openings 25 of the magnetic metal body 20 to be described below. The adhesive layer 50 may be formed across the entirety of, or a portion of, a region of the resin layer 10 that corresponds to the solid portion 21 of the magnetic metal body 20 (the region to be the second region 10b). Preferably, it is arranged so as to surround portions of the resin layer 10 that are to be the first regions 10a.

The adhesive layer 50 may be a metal layer or may be formed from an adhesive. The adhesive layer 50 may be fixed on the upper surface of the resin layer 10. For example, a metal layer may be formed, as the adhesive layer 50, by a method such as electrolytic plating and electroless plating. Any of various metal materials may be used as the material of the metal layer, which may preferably be Ni, Cu or Sn, for example. The thickness of the metal layer may be such that it can withstand the welding step in which it is welded to the magnetic metal body 20 to be described below, and it may be 1 μm or more and 100 μm or less, for example.

Then, as shown in FIGS. 5(a) and 5(b), the resin layer 10 formed on the support substrate 60 is secured on the magnetic metal body 20 so as to cover the first openings 25. The resin layer 10 and the magnetic metal body 20 are attached together with the adhesive layer 50 therebetween. A region 10a of the resin layer 10 that is located in the first opening 25 of the magnetic metal body 20 is the first region, and a region 10b that overlaps the solid portion 21 is the second region.

The magnetic metal body 20 is formed from a magnetic metal material, and includes at least one first opening 25. There is no particular limitation on the method for manufacturing the magnetic metal body 20. For example, it can be manufactured by providing a magnetic metal plate, and forming the first openings 25 in the magnetic metal plate by a photolithography process. For example, an invar (an Fe—Ni-based alloy including about 36 wt % of Ni) can be preferably used as the material of the magnetic metal body 20.

When the adhesive layer 50 is a metal layer, the adhesive layer 50 can be welded to the magnetic metal body 20 by irradiating the adhesive layer 50 with a laser beam from the resin layer 10 side. In this process, spot welding may be performed at a plurality of positions spaced apart from each other by an interval. The number of positions of spot welding and the interval (pitch) therebetween can be appropriately selected. Thus, the resin layer 10 is attached to the magnetic metal body 20 with the adhesive layer 50 therebetween.

Note that the adhesive layer 50 does not need to be a metal layer. The resin layer 10 and the magnetic metal body 20 may be attached together by using the adhesive layer 50 formed from an adhesive (a dry laminate or a heat laminate).

The adhesive layer 50 may be arranged only in the peripheral edge portion of the resin layer 10. Where a portion of the magnetic metal body 20 that overlaps the frame to be provided later is denoted as the "peripheral portion" and a portion thereof that is located in the opening of the frame as the "mask portion", the adhesive layer 50 may be arranged only between the peripheral portion of the magnetic metal body 20 and the resin layer 10. In such a case, in the mask portion, the solid portion 21 of the magnetic metal body 20 and the resin layer 10 are not bonded together.

It is preferred that the adhesive layer 50 is not formed on a portion of the resin layer 10 that is to be the first region 10a. If the adhesive layer 50 is formed in the first region 10a, the tensile stress of the resin layer 10 may possibly have an in-plane distribution across the first region 10a even after the support substrate 60 is removed from the resin layer 10 in a subsequent step.

Next, as shown in FIGS. 6(a) and 6(b), a plurality of second openings 13 are formed in the first region 10a of the resin layer 10 by a laser ablation method, for example, (the laser process step). Thus, the mask member 30 including the magnetic metal body 20 and the resin layer 10 is obtained.

A pulse laser is used for the laser process on the resin layer 10. Herein, a YAG laser is used, and a predetermined region of the resin layer 10 is irradiated with a laser beam L1 having a wavelength of 355 nm (the third harmonic). The energy density of the laser beam L1 is set to 0.36 J/cm$^2$, for example. As described above, the laser process on the resin layer 10 is performed in a plurality of shots while focusing the laser beam L1 on the surface of the resin layer 10. The shot frequency is set to 60 Hz, for example. Note that the conditions of the laser process (the wavelength of the laser beam, the irradiation conditions, etc.) are not limited to those described above, but can be selected appropriately so that the resin layer 10 can be processed.

Note that if the resin layer 10 has a stress distribution as described above, when the stress distribution in the first region 10a is leveled after the support substrate 60 is removed, the size and shape of the second openings 13 may change depending on the positions in the first region 10a. In such a case, it is preferred that the second openings 13 are formed while taking into consideration the amount of deformation of the second openings 13 due to the leveling of the stress distribution, so that the second openings 13 have an intended size and shape after the support substrate 60 is removed.

In the present embodiment, a laser process is performed on the resin layer 10 formed by curing (or baking) on the support substrate 60. Since no bubble exists between the support substrate 60 and the resin layer 10, it is possible to form the second openings 13 of an intended size with a higher precision as compared with conventional methods, and the occurrence of burrs (see FIG. 27) is also suppressed.

Then, as shown in FIGS. 7(a) and 7(b), the mask member 30 is removed from the support substrate 60. The removing of the support substrate 60 can be done by a laser lift off method, for example. When the adhesion force between the resin layer 10 and the support substrate 60 is relatively weak, the removing can be done mechanically by using a knife edge, or the like.

Herein, the resin layer 10 is removed from the support substrate 60 by irradiating with a laser beam (wavelength: 308 nm) from the support substrate 60 side by using an XeCl excimer laser, for example. Note that it is only required that the laser beam be light of a wavelength that passes through the support substrate 60 and is absorbed by the resin layer 10, and a high power laser such as another excimer laser or a YAG laser may be used.

When the support substrate 60 is removed, the resin layer 10 is kept (tightly) under tension with no slack because of the internal tensile stress. The magnitude of tensile stress in a predetermined direction can be leveled within portions of the resin layer 10 that are not attached to the magnetic metal body 20 (herein, the first regions 10a).

Thereafter, although not shown in the figure, the frame 40 is secured on the mask member 30 (the frame attachment step). The vapor deposition mask 100 shown in FIG. 1 is manufactured as described above.

In the frame attachment step, the frame 40 is placed on the peripheral portion of the magnetic metal body 20, and the peripheral portion of the magnetic metal body 20 and the frame 40 are attached together. The frame 40 is formed from a magnetic metal such as an invar, for example. The peripheral portion of the magnetic metal body 20 and the frame 40 may be welded together by irradiating with a laser beam from the resin layer 10 side (spot welding). The pitch of the spot welding can be selected appropriately. Note that in the example shown in FIG. 1, the inner edge portion of the frame 40 and the inner edge portion of the magnetic metal body 20 are generally aligned together as seen from a direction normal to the support substrate 60, but a portion of the magnetic metal body 20 may be exposed on the inner side of the frame 40. Alternatively, the frame 40 may cover the entire peripheral portion of the magnetic metal body 20 and a portion of the resin layer 10.

As described above, in the present embodiment, the step of securing the resin layer 10 and the magnetic metal body 20 on the frame 40 while stretching them in a predetermined layer in-plane direction (the stretching step) is not performed, it is possible to use the frame 40 having a lower rigidity as compared with conventional methods. Therefore, the frame 40 may be formed from a resin such as ABS (acrylonitrile butadiene styrene) and PEEK (polyether ether ketone). The method for attaching together the mask member 30 and the frame 40 is not limited to laser welding. For example, the peripheral portion of the magnetic metal body 20 and the frame 40 may be attached together by using an adhesive, for example.

Thereafter, as necessary, a magnetization step of magnetizing the magnetic metal body 20 with an electromagnetic coil is performed, adjusting the residual magnetic flux density of the magnetic metal body 20 to 10 mT or more and 1000 mT, for example. Note that the magnetization step does not need to be performed. Even if the magnetization step is not performed, the magnetic metal body 20 is a magnetic member, and the vapor deposition mask 100 can be held on the work in the vapor deposition step by using a magnetic chuck.

While a method for forming the vapor deposition mask 100 has been described above as an example, the other vapor deposition masks 200 and 300 can also be manufactured by a method similar to the method described above.

<Another Method for Manufacturing Vapor Deposition Mask>

With the method described above with reference to FIG. 3 to FIG. 7, the second openings 13 are formed in the resin layer 10 after the resin layer 10 and the magnetic metal body 20 are attached together, but the second openings 13 may be formed before the resin layer 10 and the magnetic metal body 20 are attached together. With the method described above with reference to FIG. 3 to FIG. 7, the support substrate 60 is removed from the mask member 30 before the mask member 30 and the frame 40 are attached together, but the support substrate 60 may be removed after the frame 40 and the mask member 30 are attached together. Moreover, before the resin layer 10 and the magnetic metal body 20 are attached together, the frame 40 may be attached to the magnetic metal body 20.

Another method for manufacturing a vapor deposition mask of the present embodiment will now be described with reference to the drawings. In the figures, like components to those of FIG. 3 to FIG. 7 are denoted by like reference signs. The description will focus on differences from the method described above with reference to FIG. 3 to FIG. 7, and the method of formation, material, thickness, etc., of the layers will not be described below if they are similar to those of the method described above.

FIGS. 9(a) to 9(e) are cross-sectional views each showing a step of another method for manufacturing a vapor deposition mask.

First, as shown in FIG. 9(a), the resin layer 10 is formed on the support substrate 60. The method for forming the resin layer 10 is similar to the method described above with reference to FIG. 3. Herein, the resin layer 10 is formed by applying and curing a polyimide varnish on the support substrate 60.

Then, as shown in FIG. 9(b), the second openings 13 are formed in the resin layer 10 by a laser process. The second openings 13 are formed in a region of the resin layer 10 that is located within the first opening 25 of the magnetic metal body 20 when the resin layer 10 is attached to the magnetic metal body 20 in a subsequent step.

Then, as shown in FIG. 9(c), the resin layer 10 and the magnetic metal body 20 are attached together with the adhesive layer 50 therebetween. The attachment method is similar to the method described above with reference to FIG. 5.

Thereafter, as shown in FIG. 9(d), the support substrate 60 is removed from the resin layer 10 by a laser lift off method, for example.

Then, as shown in FIG. 9(e), the frame 40 is provided on the peripheral portion of the magnetic metal body 20 by performing spot welding using a laser beam L2, for example. Thus, the vapor deposition mask 100 is obtained.

FIGS. 10(a) to 10(e) are cross-sectional views each showing a step of another method for manufacturing a vapor deposition mask.

First, as shown in FIG. 10(a), the resin layer 10 is formed on the support substrate 60. The method for forming the resin layer 10 is similar to the method described above with reference to FIG. 3.

Then, as shown in FIG. 10(b), the resin layer 10 and the magnetic metal body 20 are attached together with the adhesive layer 50 therebetween.

Then, as shown in FIG. 10(c), the second openings 13 are formed in the resin layer 10 by a laser process.

Thereafter, as shown in FIG. 10(d), the frame 40 is provided on the peripheral portion of the magnetic metal body 20 by performing spot welding using the laser beam L2, for example.

Then, as shown in FIG. 10(e), the support substrate 60 is remover from the resin layer 10 by a laser lift off method, for example. Thus, the vapor deposition mask 100 is obtained.

FIGS. 11(a) to 11(e) are cross-sectional views each showing a step of still another method for manufacturing a vapor deposition mask.

First, as shown in FIG. 11(a), the resin layer 10 is formed on the support substrate 60. The method for forming the resin layer 10 is similar to the method described above with reference to FIG. 3.

As shown in FIG. 11(b), the magnetic metal body 20 is attached to the frame 40, thereby forming a frame structure. Specifically, the frame 40 is placed on the peripheral portion of the magnetic metal body 20, and the peripheral portion and the frame 40 are attached together. Herein, the peripheral portion of the magnetic metal body 20 and the frame 40 are welded together by irradiating from the magnetic metal body 20 side with a laser beam L3. For example, spot welding may be performed at a plurality of positions with a predetermined interval therebetween. Note that the magnetic metal body 20 may be attached to the frame 40 with a constant tension acting in a predetermined direction on the magnetic metal body 20 by using a stretch welding machine. Note however that in the present embodiment, there is no need to apply a high tension because it is only required that the magnetic metal body 20 be secured on the frame 40.

Then, as shown in FIG. 11(c), the resin layer 10 and the magnetic metal body 20 are attached together with the adhesive layer 50 therebetween.

Then, as shown in FIG. 11(d), the second openings 13 are formed in the resin layer 10 by a laser process.

Thereafter, as shown in FIG. 11(e), the support substrate 60 is removed from the resin layer 10 by a laser lift off method, for example. Thus, the vapor deposition mask 100 is obtained.

Thus, the vapor deposition mask 100 of the present embodiment can be manufactured by various methods. Note that with the method shown in FIG. 9, it is necessary to perform a high-precision alignment when the resin layer 10 with the second openings 13 formed therein is attached to the magnetic metal body 20. In contrast, if the second openings 13 are formed after the resin layer 10 and the magnetic metal body 20 are attached together, there is advantageously no need to perform such a high-precision alignment.

Figure 10:
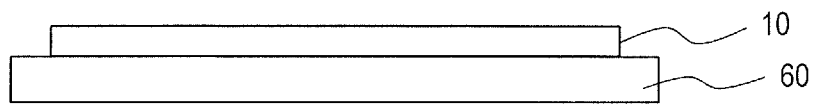
FIGS. 10(a) to 10(e) are cross-sectional views each showing a step of another method for manufacturing a vapor deposition mask according to an embodiment of the present invention.
Figure 10:
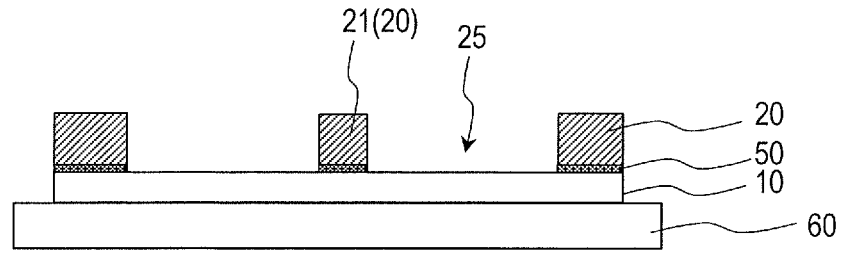
Figure 10:
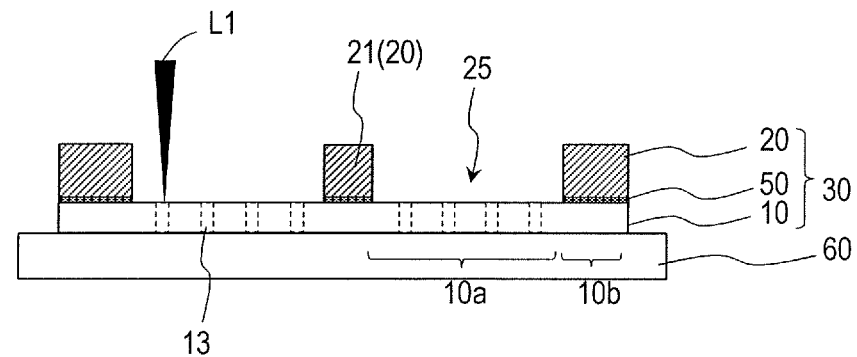
Figure 10:
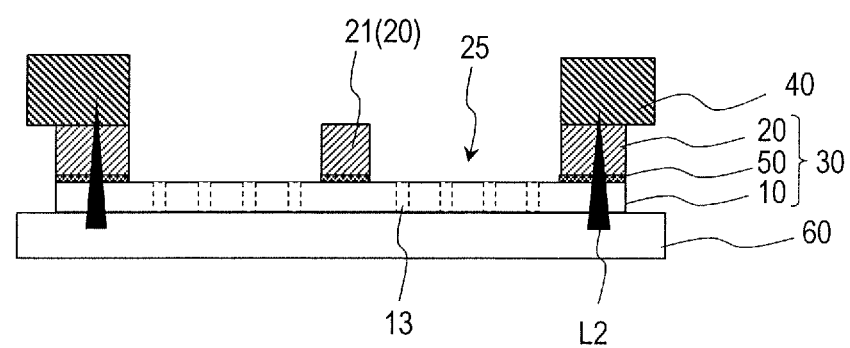
Figure 10:
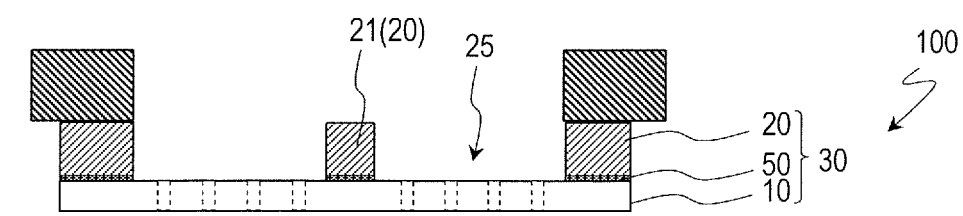
Figure 11:
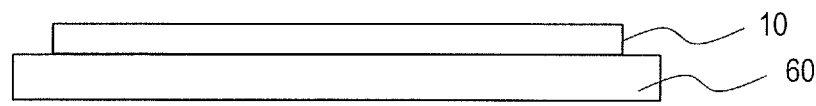
FIGS. 11(a) to 11(e) are cross-sectional views each showing a step of still another method for manufacturing a vapor deposition mask according to an embodiment of the present invention.
Figure 11:
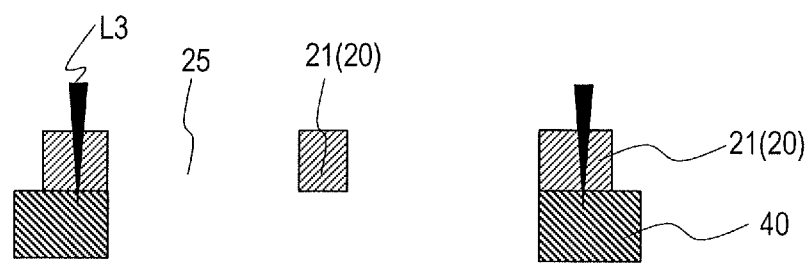
Figure 11:
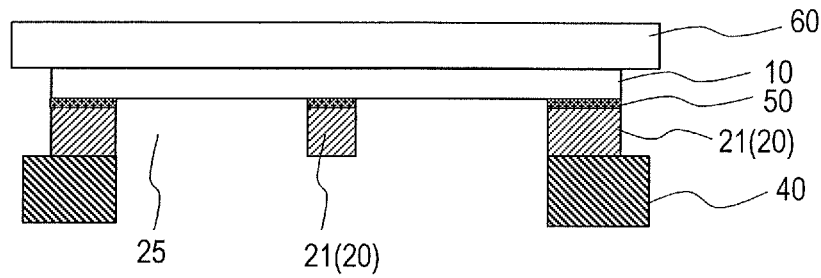
Figure 11:
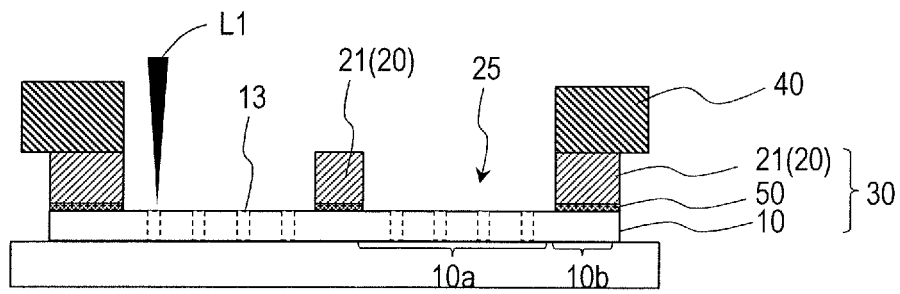
Figure 11:
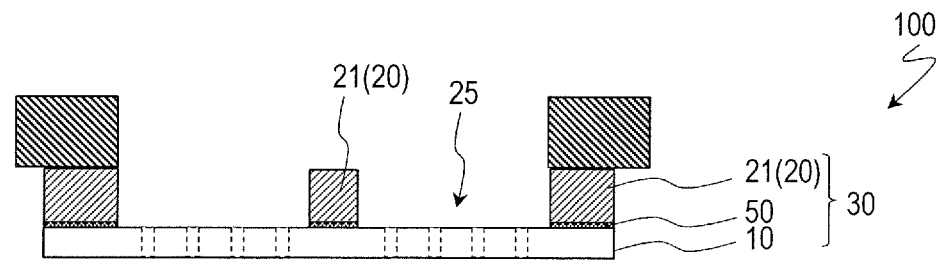

With the method shown in FIG. 10 and FIG. 11, the frame 40 is attached before the support substrate 60 is removed. In such a case, the support substrate 60 is removed by placing the support substrate 60, with the heavy and bulky frame 40 attached thereto, on the stage of a laser lift-off device. Therefore, as compared with other methods, it is necessary that the stage of the laser lift-off device to be used be large and strong. Moreover, the distance WD between the laser head and the stage (the work distance) needs to be large. In contrast, performing the attachment step of the frame 40 after the support substrate 60 is removed is more practical because there will not be such limitations as described above on the size, strength and WD for the stage of the laser lift-off device.

<Advantageous Effects of Manufacturing Method of Present Embodiment>

With the method for manufacturing a vapor deposition mask of the present embodiment, the resin layer 10 is formed by applying a solution including a resin material or a solution including a precursor of a resin material on the surface of the support substrate 60, and performing a heat treatment. The resin layer 10 formed by this method is in close contact with the support substrate 60, and no bubble occurs at the interface between the resin layer 10 and the support substrate 60. Therefore, by forming a plurality of second openings 13 in the resin layer 10 on the support substrate 60, it is possible to form second openings 13 of an intended size with a higher precision as compared with conventional methods, and it is also possible to suppress the occurrence of the burrs 98 (see FIG. 27).

According to the present embodiment, an intended tensile stress can be caused on the resin layer 10. Thus, it is possible to reduce the bend amount in the first region 10a of the resin layer 10. Therefore, the resin layer 10 can be kept in close contact on the vapor deposition substrate without arranging a magnetic metal close to the second openings 13 of the first region 10a. Therefore, it is possible to increase the size of the first opening 25, and it is possible to allow the use of an open mask, for example. It is also possible to use the magnetic metal body 20 of which the area ratio of the solid portion is very small (e.g., 50% or less with respect to the area of the mask portion). Moreover, there is no need to form a magnetic metal layer that is patterned with a high precision, and it is therefore possible to simplify the manufacturing step. Furthermore, it is also possible to use a metal material having a large thermal expansion coefficient $\alpha M$. Therefore, the degree of freedom in selecting the shape and the metal material of the magnetic metal body 20 can be increased as compared with conventional methods.

In the present embodiment, the resin layer 10 is formed on the support substrate 60, and the resin layer 10 being supported on the support substrate 60 is attached to the magnetic metal body 20. Since the resin layer 10 has a predetermined tensile stress as a residual stress, the stretching step of attaching the resin layer 10 to the frame while stretching the resin layer 10 is not performed. Since there is no need to perform the stretching step using a large-scale stretcher, it is possible to reduce the manufacturing cost. Since the stretching step is not performed, tension in a predetermined layer plane direction(s) is not applied to the magnetic metal body 20 from the frame 40. Therefore, the rigidity of the frame 40 can be made smaller as compared with conventional methods, thereby increasing the degree of freedom in selecting the material of the frame 40 and the degree of freedom in designing the width, the thickness, etc., of the frame.

With conventional methods described in Patent Document No. 1, etc., a laser process for the resin film is performed after the resin film is secured to the frame by the stretching step. In contrast, according to the present embodiment, the attachment step of the frame 40 may be performed before the laser process on the resin layer 10 or after the laser process. There are advantages as follows when the attachment step of the frame 40 is performed after the laser process. The mask member 30 supported on the support substrate 60 before the frame 40 is attached thereto (including the mask member before the laser process) is lighter and easier to handle than the mask member 30 after the frame 40 is attached thereto, thereby facilitating operations such as placing it on the laser process machine and carrying it around. Since the frame 40 is not attached thereto, it is easy to irradiate the resin layer 10 with the laser beam L1 and it is easy to process the resin layer 10. Moreover, with the method of Patent Document No. 1, when the laser process of the resin layer is not successful, there is a need to remove the layered mask off the frame. However, if the laser process is performed before the frame 40 is attached, there is no need for such a removing step.

Moreover, a resin film that has been secured to the frame by the stretching step is sensitive to changes in surrounding environments such as humidity and temperature, and the bend amount of the resin film may vary depending on the surrounding environments. In contrast, in the present embodiment, the bend of the resin layer 10 is zero or very small, and the bend amount does not substantially change over time.

The magnitude of temperature increase of the vapor deposition mask during the vapor deposition step, i.e., the difference $\Delta T$ (° C.) (=T2−T1) between temperature T1 of the vapor deposition mask during the manufacturing process and temperature T2 of the vapor deposition mask during the vapor deposition step varies depending on the vapor deposition method, the vapor deposition device, etc. When the temperature difference $\Delta T$ is suppressed to be relatively small, $\Delta T$ is less than 3° C., i.e., about 1° C. On the other hand, $\Delta T$ may be about 3° C. to about 15° C. Note that temperature T1 during the manufacturing process of the present embodiment is the temperature of the environment in which the manufacturing device (e.g., the laser process machine used for processing the resin layer 10, the welder used in the frame attachment step, etc.) is installed, e.g., room temperature. When vapor deposition is performed while relatively moving (scanning) the position of the vapor deposition source with respect to the work, temperature T2 during the vapor deposition step refers to the temperature of the portion of the vapor deposition mask where vapor deposition is being performed. In the present embodiment, when $\Delta T$ is relatively large (e.g., over 3° C.), it is possible to suppress the positional misalignment by the following method, as necessary. First, the temperature increase ($\Delta T$) of the vapor deposition mask is measured in advance. Then, based on the measurement result of $\Delta T$, the amount of positional misalignment occurring due to thermal expansion is calculated. The amount of positional misalignment includes the misalignment between the position of the second opening 13 and the vapor deposition position, and the misalignment between the shape of the second opening 13 and the intended vapor deposition pattern caused by the deformation of the second opening 13 itself. The size of the second opening 13 of the resin layer 10 is formed to be smaller than the intended vapor deposition pattern by a predetermined amount so as to cancel out the amount of positional misalignment. Note that instead of calculating the amount of positional misalignment, the amount of positional misalignment may be measured through an actual vapor deposition process.

(Relationship Between Heat Treatment Condition and Tensile Stress of Resin Layer)

The present inventors studied the relationship of the resin layer formation conditions (heat treatment conditions) with the tensile stress of the resin layer and the bend amount of the resin layer. The method and results of the study will now be described.

Method for Producing Samples A to C

Figure 12:
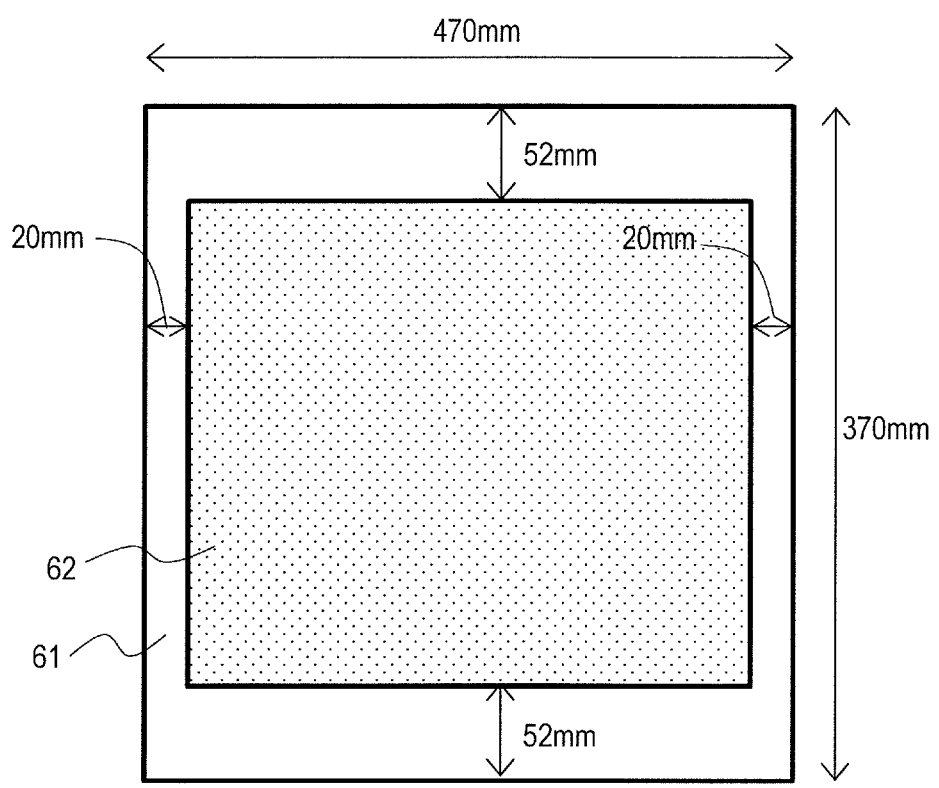
FIG. 12 is a top view showing Samples A to C.

A polyimide film 62 was formed on a glass substrate 61 while varying the heat treatment conditions, thereby obtaining Samples A to C. FIG. 12 is a top view of Samples A to C.

First, the glass substrate (AN-100 from Asahi Glass Co., Ltd.) 61 was provided as the support substrate. The thermal expansion coefficient of the glass substrate 61 was 3.8 ppm/° C., the size thereof was 370 mm×470 mm, and the thickness thereof was 0.5 mm.

A polyimide varnish (U-Varnish-S from Ube Industries, Ltd.) was applied on a portion of the glass substrate 61 described above. Herein, the polyimide varnish was applied over a predetermined area (330 mm×366 mm) of the glass substrate 61 as shown in FIG. 12.

Then, a heat treatment was performed under a vacuum atmosphere (pressure: 20 Pa) on the glass substrate 61 with a polyimide varnish applied thereon, thereby forming the polyimide film 62. In the heat treatment, the temperature was increased from room temperature (herein, 25° C.) to 500° C. (highest temperature), and the temperature was held at 500° C. for a predetermined amount of time. Thereafter, a nitrogen gas was supplied as a purge gas, followed by rapid cooling (3 min). Table 1 shows the heating time up to 500° C., the hold time at 500° C., the heating speed (from room temperature to when 500° C. was reached) and the thickness of the polyimide film 62 for each sample.

Thus, the glass substrates 61 with the polyimide film 62 formed thereon were obtained as Samples A to C. With Samples A to C, the tensile stress of the polyimide film 62 gave a compressive stress on the glass substrate 61, thereby warping the glass substrate 61. Table 1 shows the average value of the warp amount of the glass substrate 61 in the longitudinal direction and that in the width direction.

Calculation of Tensile Stress of Polyimide Film 62

Then, the tensile stress of the polyimide film 62 was calculated based on the warp amount of the glass substrate 61 for Samples A to C. The results are shown in Table 1. The tensile stress can be obtained from the thickness, the Young's modulus and the Poisson's ratio of the glass substrate 61, the thickness of the polyimide film 62, and the radius of curvature (approximate value) of the warp of the glass substrate 61, by using the Stoney's formula.

Table 1 also shows the results obtained when a polyimide film was produced under a low heating speed condition for reference (denoted as "Sample D"). As shown in Table 1, Sample D was heated in a stepwise manner up to 450° C. by holding the temperature for a predetermined amount of time after reaching 120° C., 150° C. and 180° C. The tensile stress of Sample D was a value calculated assuming that the warp of the glass substrate 61 was 10 μm.

TABLE 1

| | | Sample A | Sample B | Sample C | Sample D |
|---|---|---|---|---|---|
| Heat treatment conditions | Temperature | Room temp to 500° C. | | | Room temp to 450° C. |
| | Pressure | 20 Pa | | | Atmospheric pressure |
| | Heating time | 8 min (heat for 3 min, hold for 5 min) | 13 min (heat for 8 min, hold for 5 min) | 21 min (heat for 16 min, hold for 5 min) | 195 min (holding at 120° C. for 10 min, holding at 150° C. for 10 min, holding at 180° C. for 60 min, holding at 450° C. for 30 min) |
| | Heating speed | 158° C./min | 59° C./min | 30° C./min | 5° C./min |
| Thickness of polyimide film (μm) | | 10 | 20 | 20 | 20 |
| Warp amount of glass substrate in longitudinal direction (μm) | | 23 | 620 | 230 | 10 or less |
| Warp amount of glass substrate in width direction (μm) | | 6 | 400 | 130 | 10 or less |
| Tensile stress on polyimide film (MPa) | | 0.2 | 9.6 | 3.3 | 0.2 |

Moreover, six samples B1 to B6 were produced using the same heat treatment conditions, and the tensile stress on the polyimide film 62 was calculated. The heat treatment conditions for Samples B1 to B6 were similar to those for Sample B (room temperature to 500° C., pressure: 20 Pa, heating time: 13 min (heating for 8 min+holding for 5 min), heating speed: 59° C./min). Note however that the speed of depressurizing the chamber in which the glass substrate 61 with a polyimide varnish applied thereon was placed before the heat treatment was set to be lower than that for Sample B. Also for these samples, the tensile stress on the polyimide film was obtained from the warp amount of the glass substrate as described above. The results are shown in Table 2.

TABLE 2

| | B1 | B2 | B3 | B4 | B5 | B6 |
|---|---|---|---|---|---|---|
| Thickness of polyimide film (μm) | | | | 20 | | |
| Warp amount of glass substrate in longitudinal direction (μm) | 750 | 700 | 710 | 680 | 690 | 670 |
| Warp amount of glass substrate in width direction (μm) | 500 | 500 | 520 | 470 | 500 | 540 |

TABLE 2-continued

|  | B1 | B2 | B3 | B4 | B5 | B6 |
|---|---|---|---|---|---|---|
| Tensile stress on polyimide film (MPa) | 11.7 | 11.4 | 11.7 | 10.8 | 11.2 | 11.4 |

From the results above, it was confirmed that it is possible to control the tensile stress on the resin layer on the support substrate based on the heat treatment conditions. For example, it was found that it is possible to form a resin layer of a large tensile stress by increasing the heating speed. Note that although the heat treatment was performed while varying the heating speed for each sample, it is possible to vary the magnitude of tensile stress on the resin layer also by varying the heat treatment conditions other than the heating speed.

Examples

Examples of vapor deposition masks were produced, and the bend amount of the resin layer was evaluated therefor, the results of which will now be described.

Figure 13:
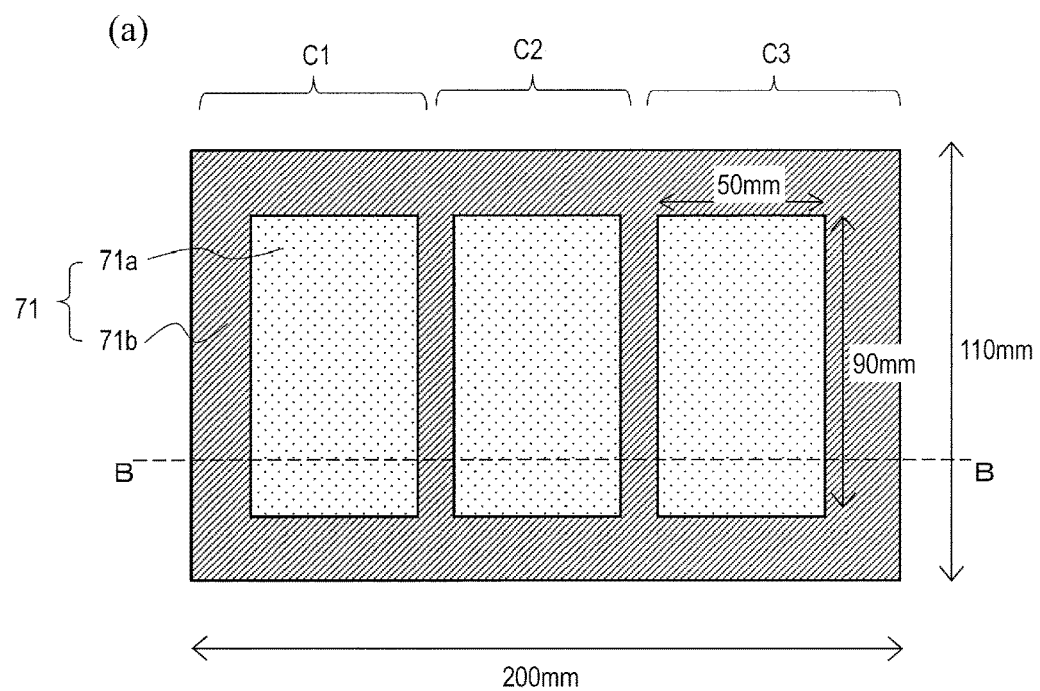
FIGS. 13(a) and 13(b) are a plan view and a cross-sectional view, respectively, showing a vapor deposition mask of Example 1.

FIG. 13(a) is a plan view showing a vapor deposition mask of Example 1, and FIG. 13(b) is a cross-sectional view taken along line B-B of FIG. 13(a). The method for producing the vapor deposition mask of Example 1 was similar to the method described above with reference to FIG. 11.

Production of Vapor Deposition Mask of Example 1

In Example 1, a glass substrate (200×130 mm, thickness: 0.5 mm) was used as the support substrate. A polyimide film (thickness: 20 μm) 71 was formed on the glass substrate under similar heat treatment conditions to those for Sample B described above.

An open mask (200×110 mm, thickness: 100 μm) 72 having three first openings (50 mm×90 mm) 73 was provided as the magnetic metal body. The open mask 72 was welded to an SUS frame (200×130 mm, thickness: 10 mm, frame width: 20 mm) (not shown).

Then, an epoxy resin adhesive (EP330 from Cemedine Co., Ltd.) 75 was applied, as the adhesive layer, on a portion of the polyimide film 71 on the glass substrate. Thereafter, the polyimide film 71 and the open mask 72 were attached to each other with the adhesive 75 therebetween.

Then, the support substrate was removed from the polyimide film 71. No second openings were provided in the polyimide film 71. Thus, the vapor deposition mask of Example 1 was obtained.

The vapor deposition mask of Example 1 includes three cells C1 to C3. Herein, "cell" refers to a first opening 73 and an area therearound, as the vapor deposition mask is seen from a normal direction, and corresponds to the unit region U described above. In each cell, a region 71a of the polyimide film 71 that is exposed through the first opening 73 is referred to as the "first region", and a region 71b attached to the open mask 72 by the adhesive 75 is referred to as the "second region".

Production of Vapor Deposition Mask of Example 2

The vapor deposition mask of Example 2 was produced by a method similar to Example 1 except that the polyimide film 71 was formed under similar heat treatment conditions to those for Sample D described above. Note however that in Example 2, the polyimide film 71 was not applied to one of the three first openings 73 of the open mask 72 that was located at the center. Thus, the vapor deposition mask of Example 2 includes two cells.

Observation of Vapor Deposition Masks of Examples 1 and 2

Figure 23:
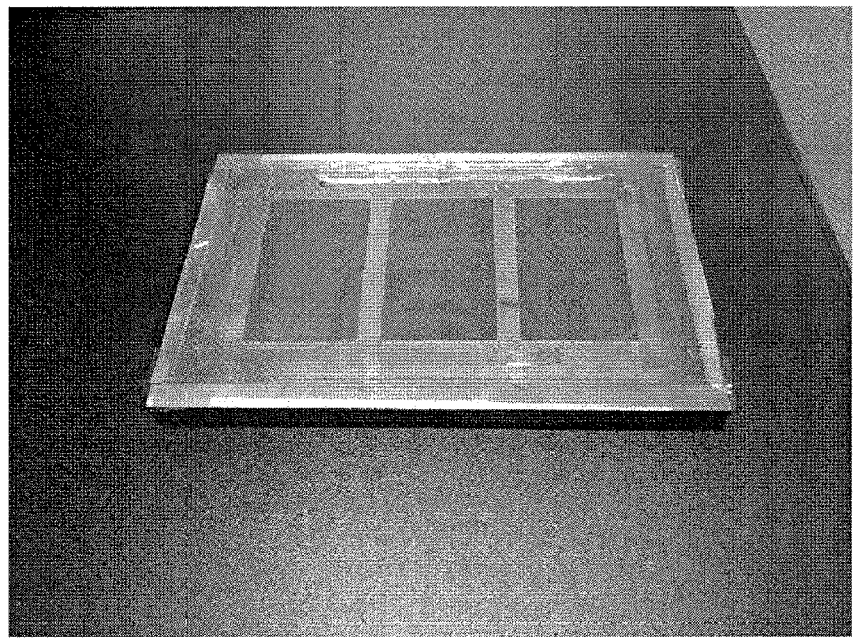
FIGS. 23(a) and 23(b) show vapor deposition masks of Examples 1 and 2, respectively.
Figure 23:
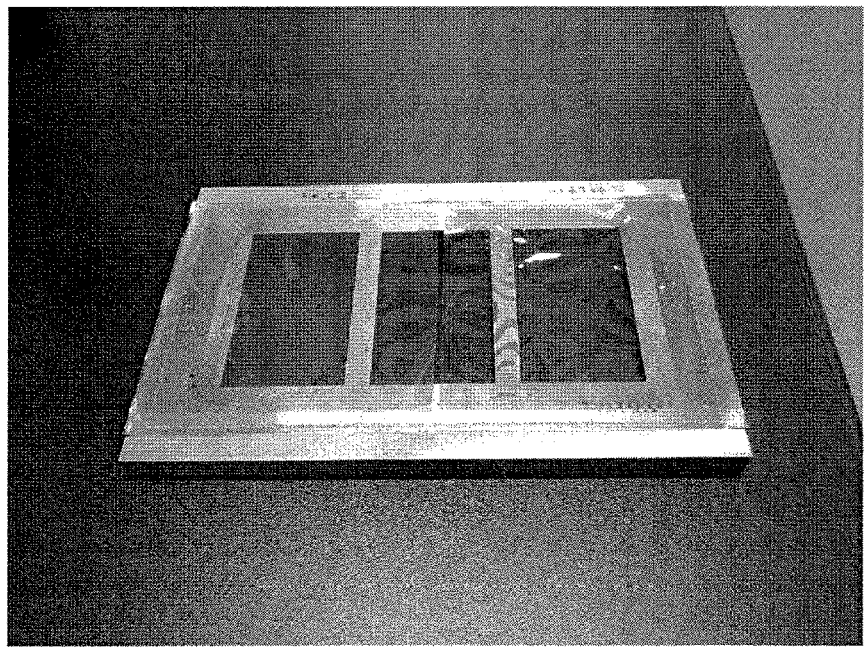

Photographs of the vapor deposition masks of Example 1 and Example 2 are shown in FIGS. 23(a) and 23(b). With the vapor deposition mask of Example 1, there are no creases dependent on the bend of the polyimide film 71. The polyimide film 71 is observed to have a pattern that seems to be dependent on the film stress distribution. On the other hand, with the vapor deposition mask of Example 2, there are creases dependent on the bend of the polyimide film 71, and it can be seen that the bend is large in the central portion of the cell.

Bend Measurement of Polyimide Film 71

The bend of the polyimide film 71 was measured for each of the cells C1 to C3 of the vapor deposition mask of Example 1.

Figure 14:
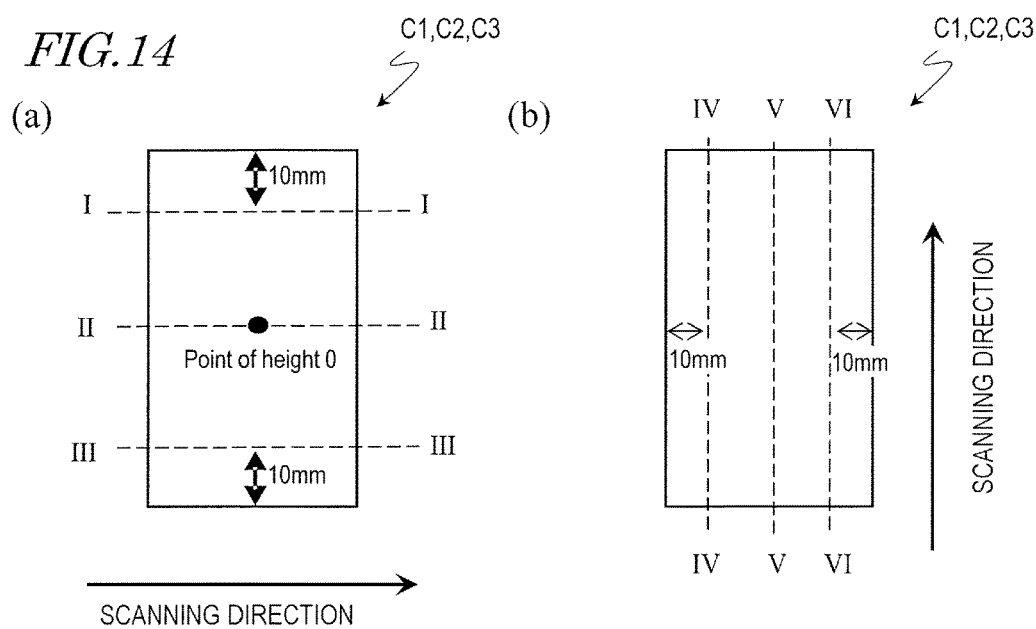
FIGS. 14(a) and 14(b) are plan views each showing the scan direction in a bend measurement.
Figure 15:
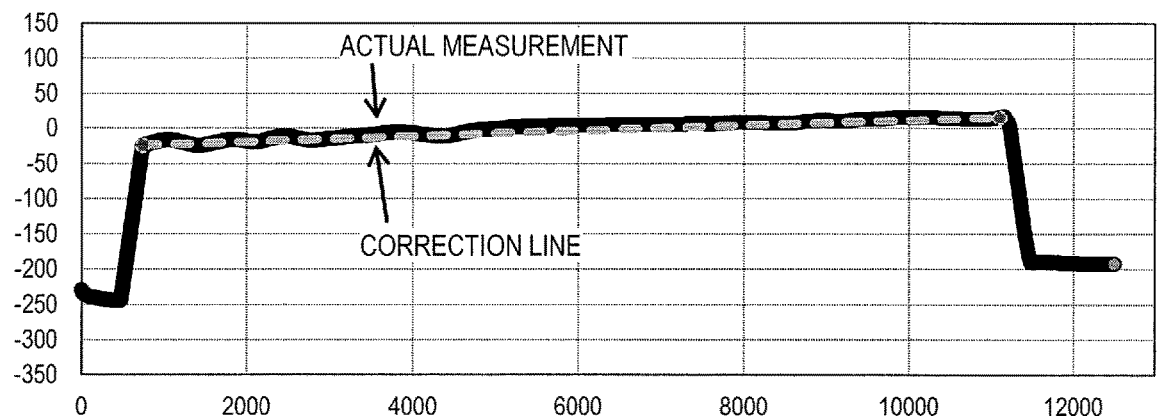
FIGS. 15(a) to 15(c) are graphs each showing the change in the height of the polyimide film of a cell C1 in a vapor deposition mask of Example 1.
Figure 15:
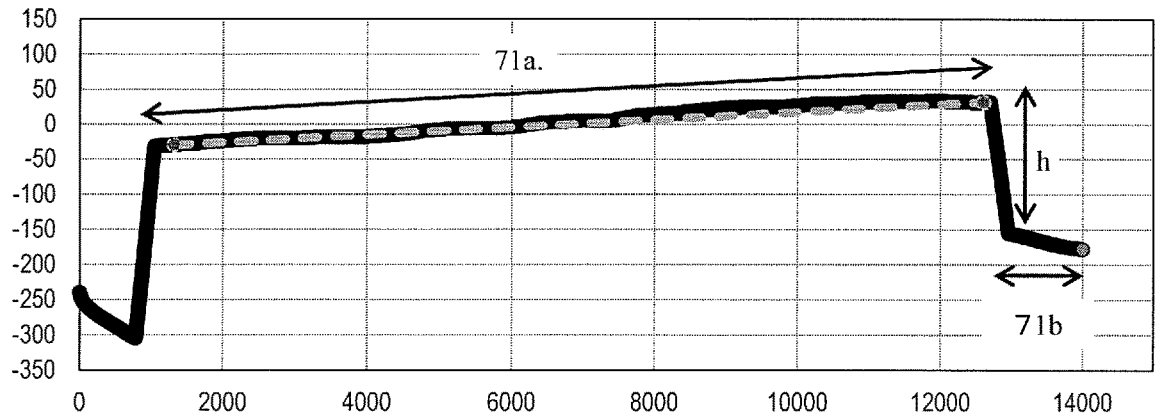
Figure 15:
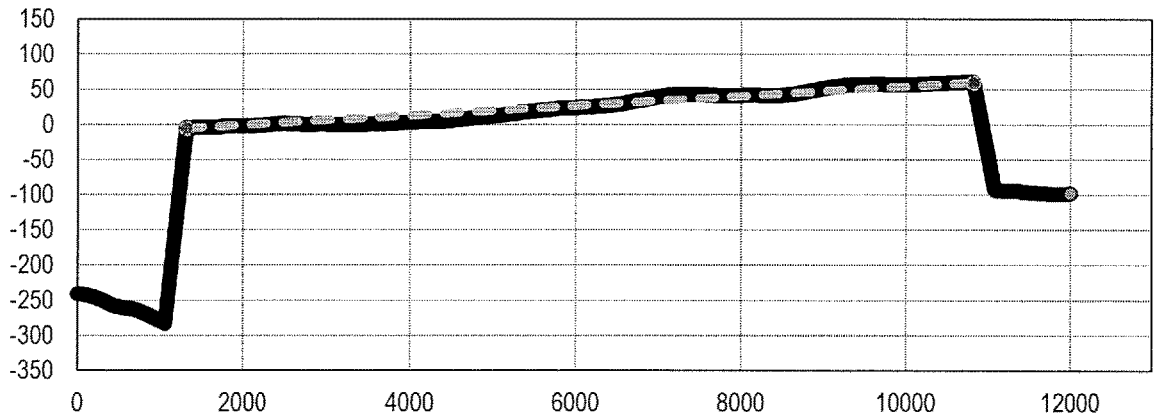
Figure 16:
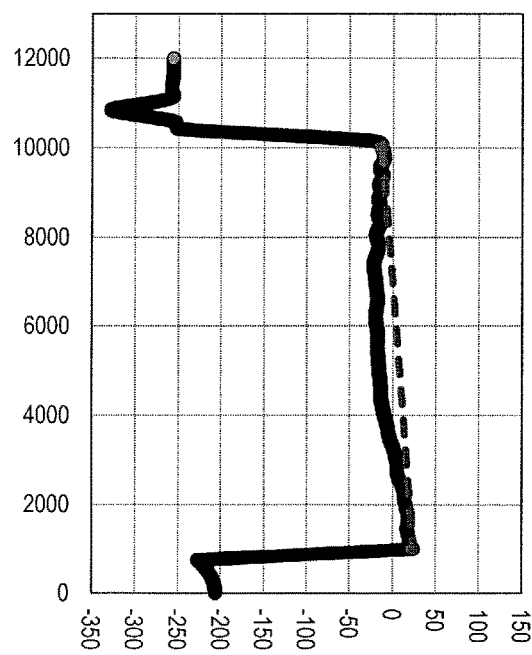
FIGS. 16(a) to 16(c) are graphs each showing the change in the height of the polyimide film of the cell C1 in the vapor deposition mask of Example 1.
Figure 16:
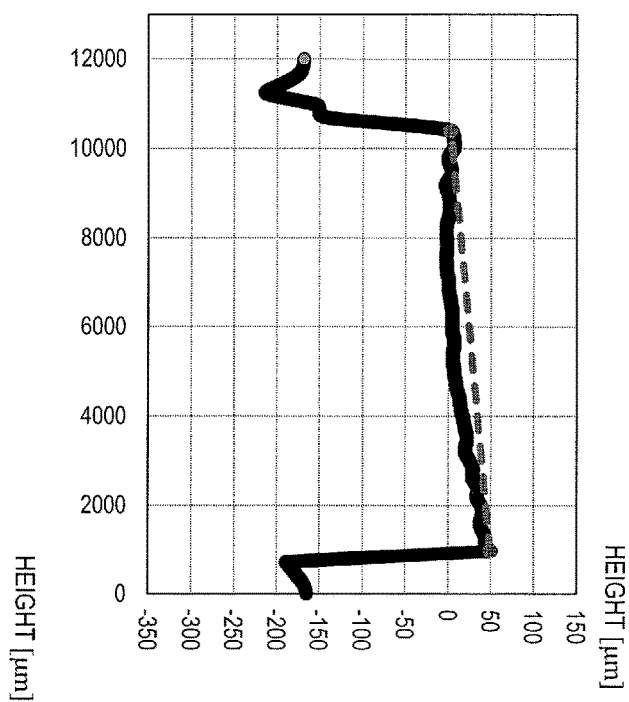
Figure 16:
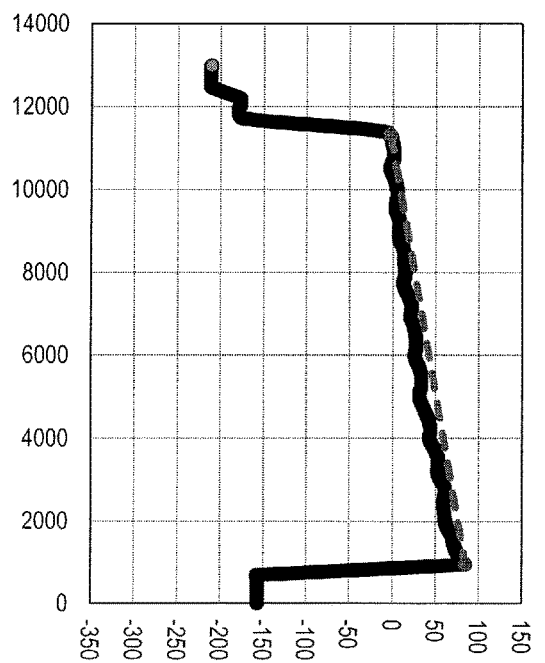

FIGS. 14(a) and 14(b) are plan views each showing the scan direction of each cell in the bend measurement. The change in the height of the polyimide film 71 was examined by scanning the first opening 73 of each cell in the width direction and in the longitudinal direction by using a laser displacement motor (LK-H057K from Koyonco Corporation). The data sampling frequency was set to 200 μs.

FIG. 15 to FIG. 20 are graphs showing the measurement results of the polyimide film 71 of each cell in the vapor deposition mask of Example 1.

Figure 17:
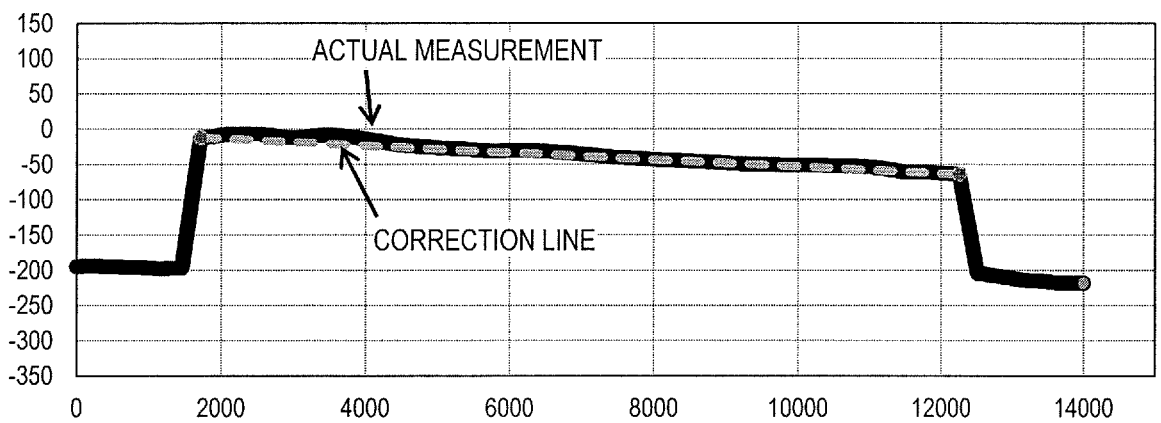
FIGS. 17(a) to 17(c) are graphs each showing the change in the height of the polyimide film of a cell C2 in the vapor deposition mask of Example 1.
Figure 17:
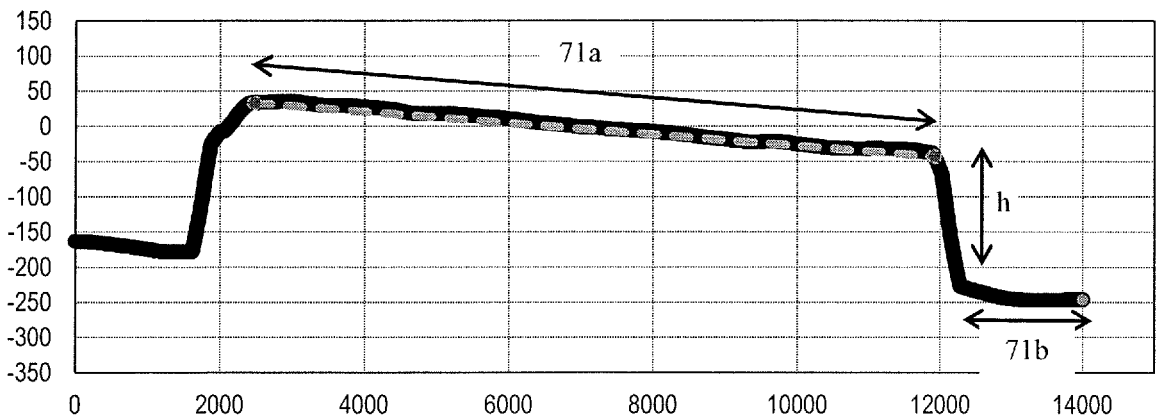
Figure 17:
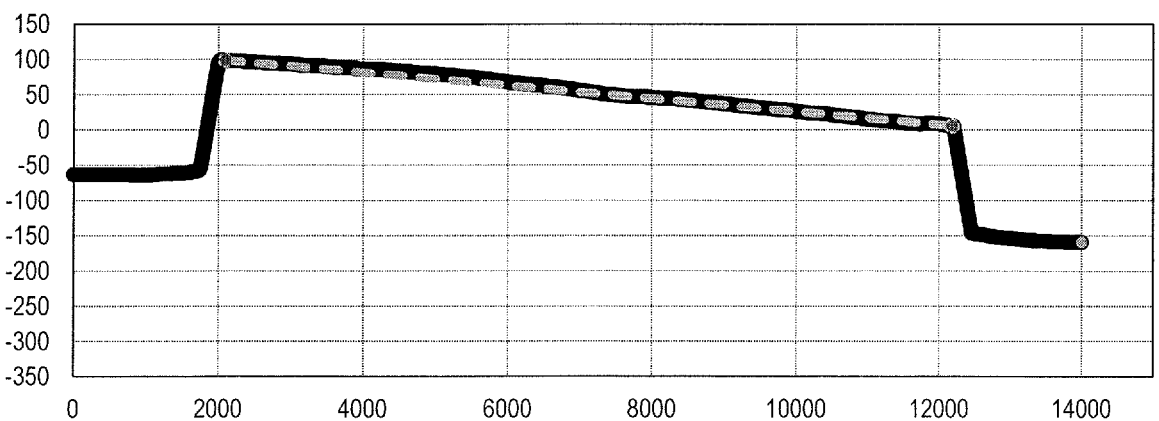
Figure 18:
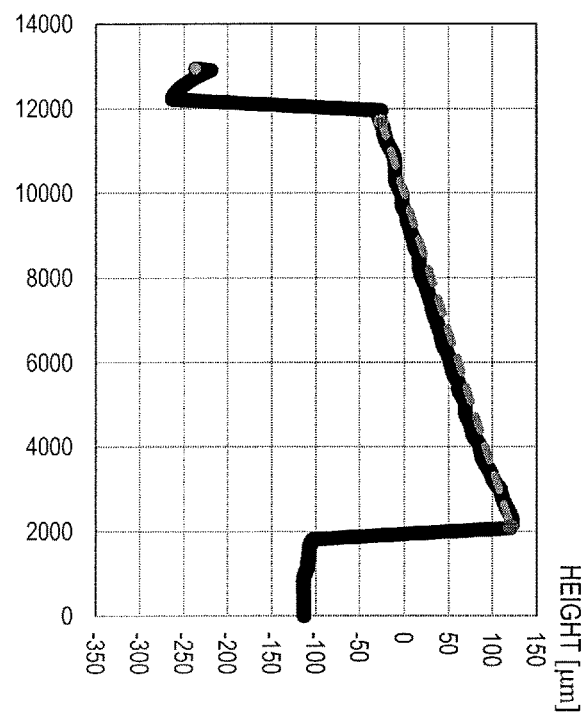
FIGS. 18(a) to 18(c) are graphs each showing the change in the height of the polyimide film of the cell C2 in the vapor deposition mask of Example 1.
Figure 18:
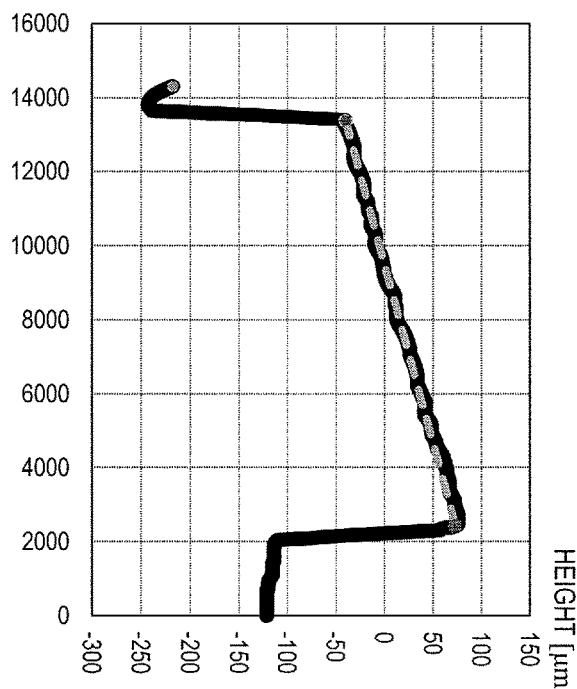
Figure 18:
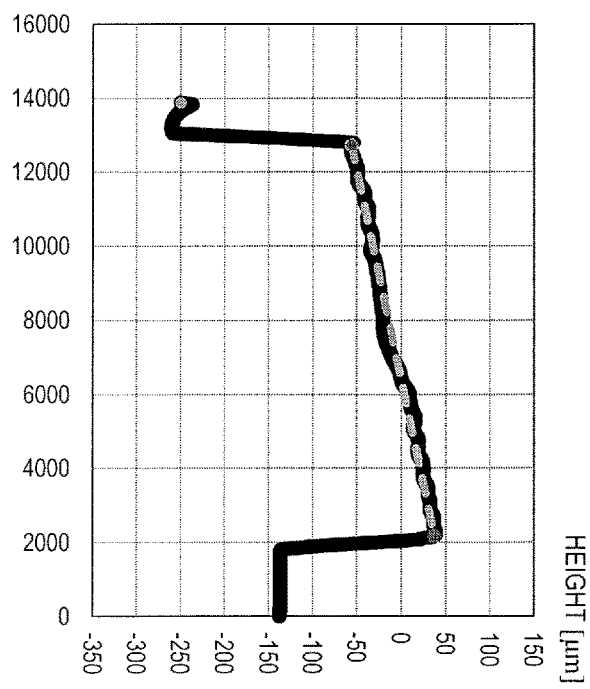
Figure 19:
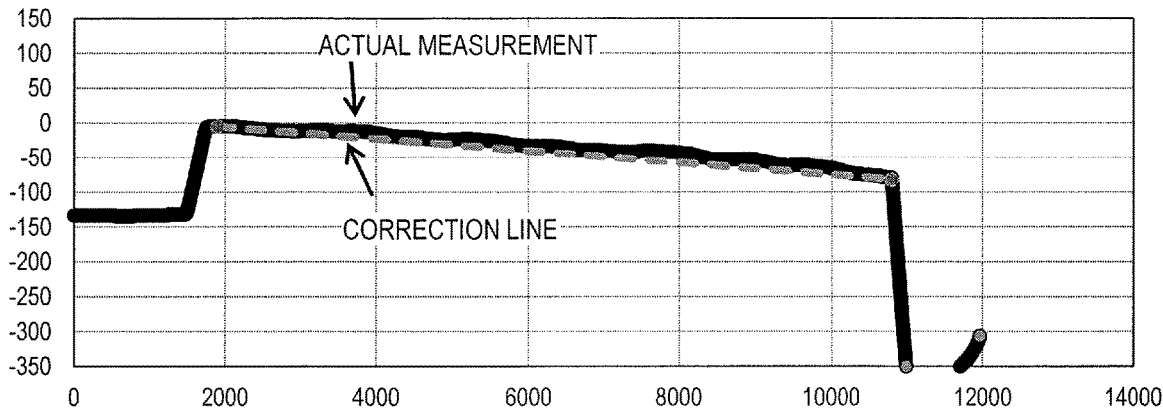
FIGS. 19(a) to 19(c) are graphs each showing the change in the height of the polyimide film of a cell C3 in the vapor deposition mask of Example 1.
Figure 19:
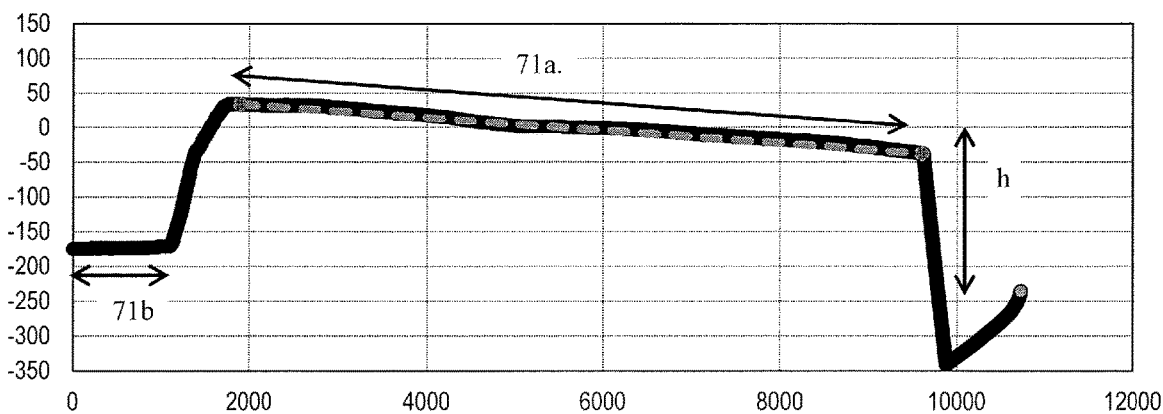
Figure 19:
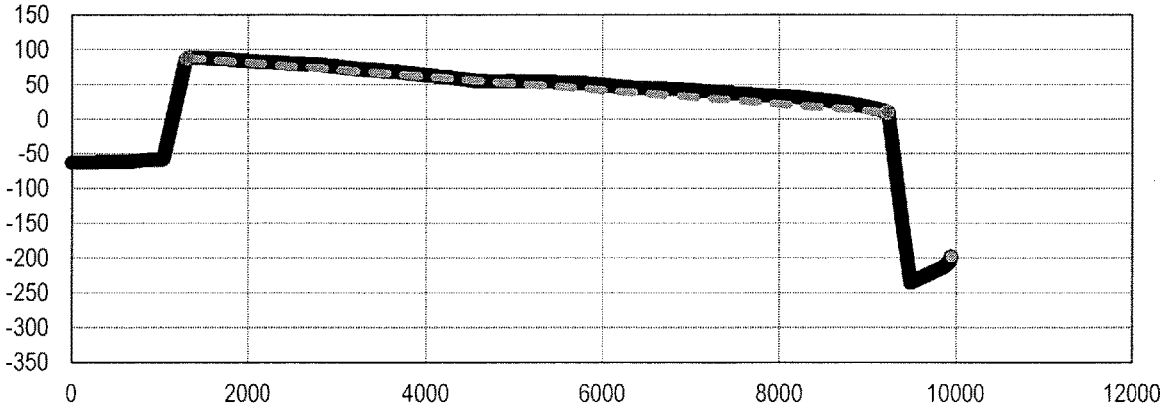
Figure 20:
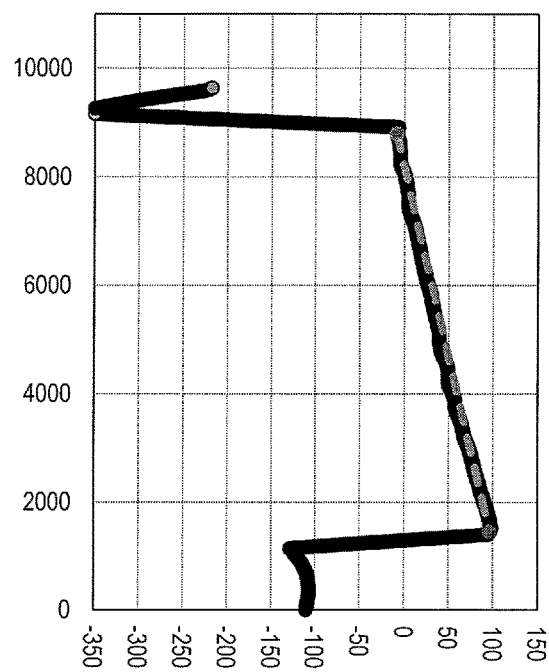
FIGS. 20(a) to 20(c) are graphs each showing the change in the height of the polyimide film of the cell C3 in the vapor deposition mask of Example 1.
Figure 20:
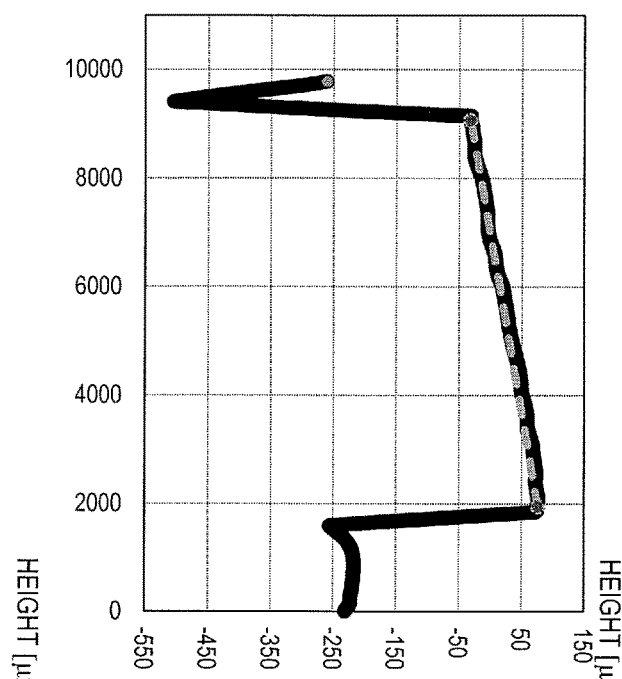
Figure 20:
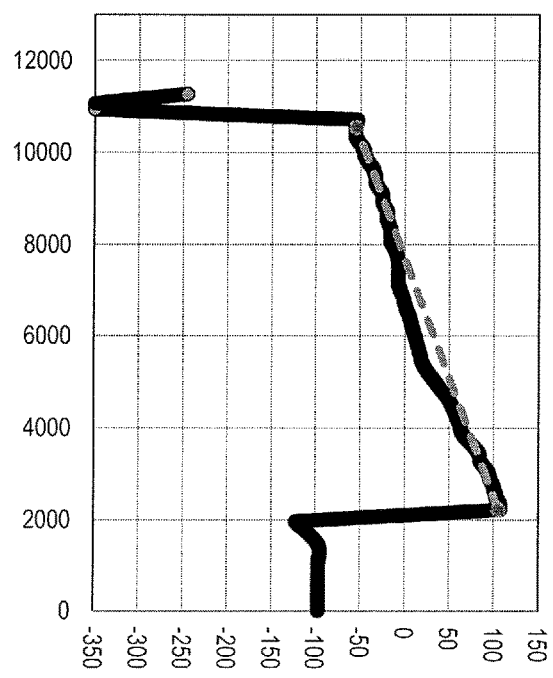
Figure 21:
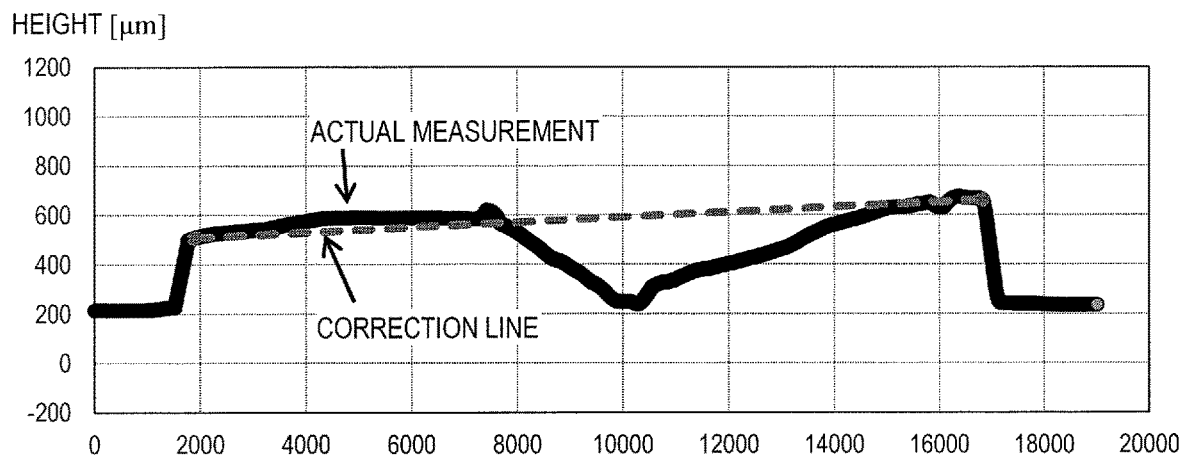
FIGS. 21(a) to 21(c) are graphs each showing the change in the height of the polyimide film of a cell in a vapor deposition mask of Example 2.
Figure 21:
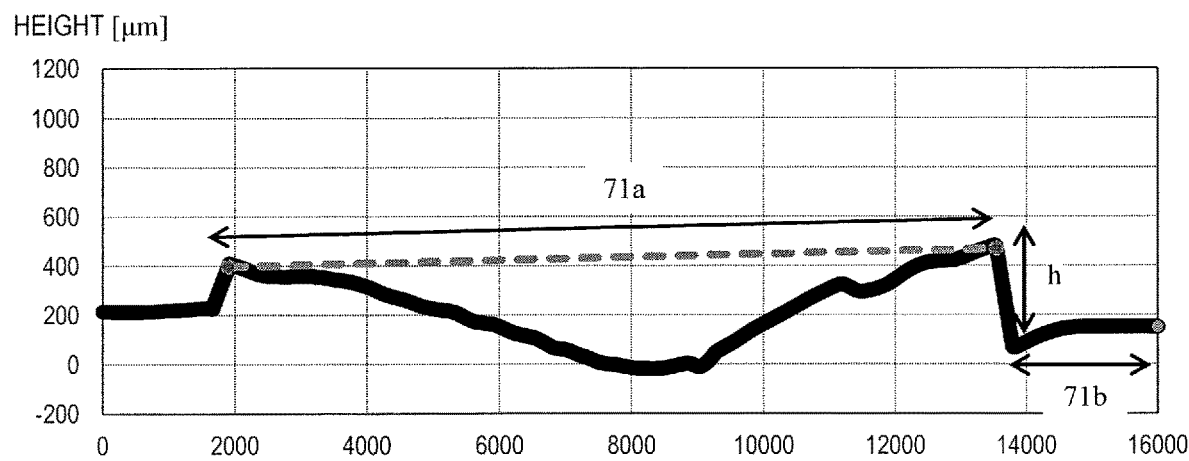
Figure 21:
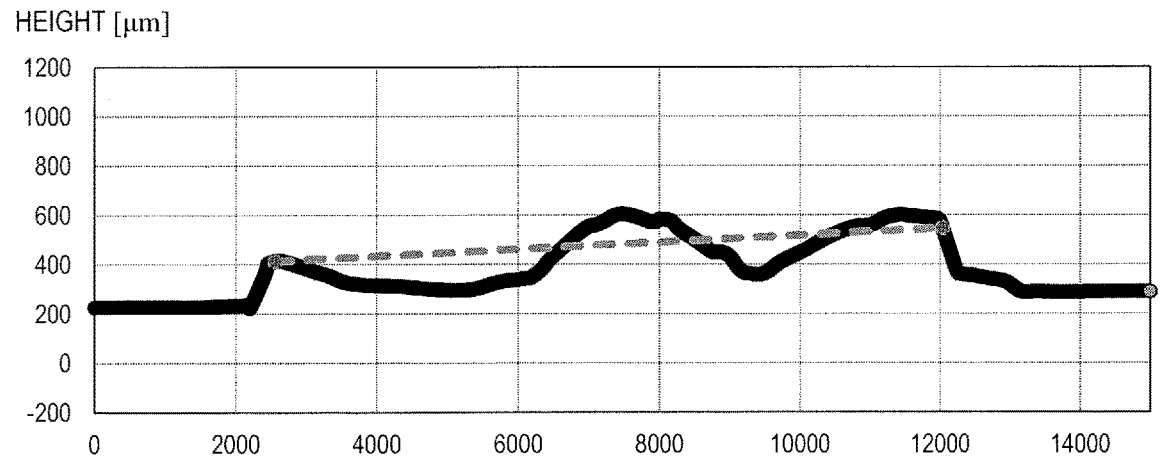
Figure 22:
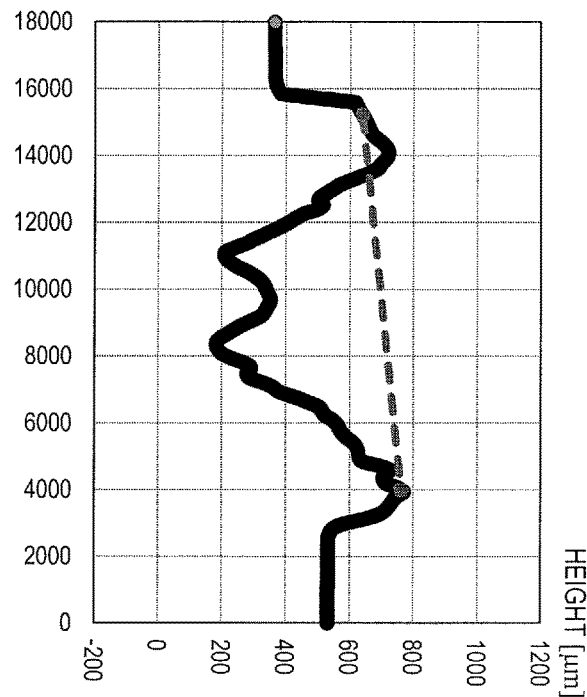
FIGS. 22(a) to 22(c) are graphs each showing the change in the height of the polyimide film of the cell in the vapor deposition mask of Example 1
Figure 22:
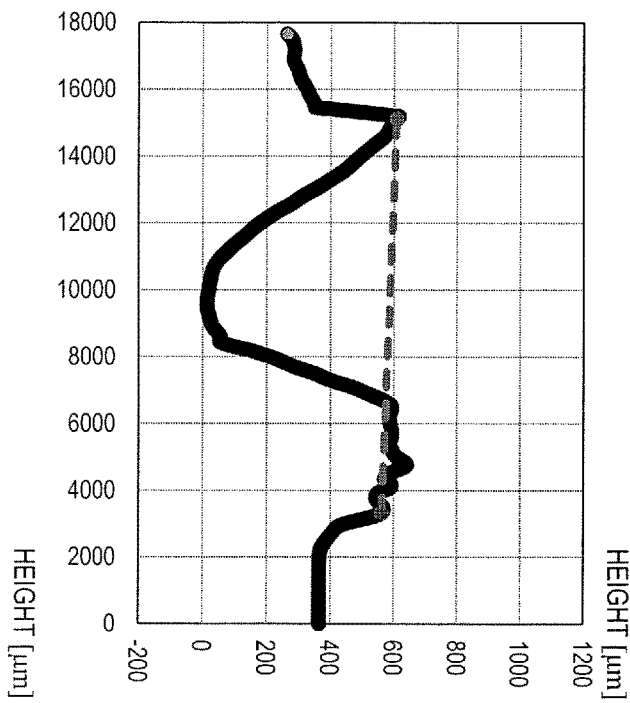
Figure 22:
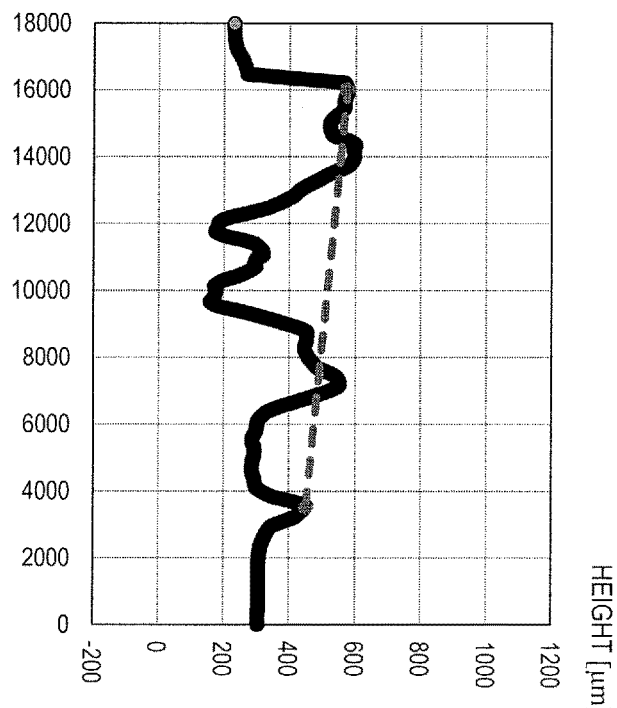

FIGS. 15(a) to 15(c) and FIGS. 16(a) to 16(c) are graphs each showing the change in the height of the polyimide film 71 of the cell C1 in the vapor deposition mask of Example 1. Similarly, FIGS. 17(a) to 17(c) and FIGS. 18(a) to 18(c) are graphs each showing the change in the height of the polyimide film 71 of the cell C2, and FIGS. 19(a) to 19(c) and FIGS. 20(a) to 20(c) are graphs each showing the change in the height of the polyimide film 71 of the cell C3. In FIG. 15, FIG. 17 and FIG. 19, (a) to (c) show the measurement results obtained by scanning the polyimide film 71 in the width direction of the cell along lines I-I, II-II and III-III, respectively, of FIG. 14(a). In FIG. 16, FIG. 18 and FIG. 20, (a) to (c) show the measurement results obtained by scanning the polyimide film 71 in the longitudinal direction of the cell along lines of IV-IV, V-V and VI-VI, respectively, of FIG. 14(a).

In these figures, the vertical axis represents the height of the polyimide film 71, which is the value obtained with respect to the height of the central portion of each cell. The horizontal axis represents the number of data points obtained at an interval of 200 μs. Note that since the sensor is moved manually for the measurement and the scanning speed of the sensor is not constant, the horizontal axis does not correspond to the distance.

In FIG. 15 to FIG. 20, the height of the first region 71a of the polyimide film 71 has a gradient, which is dependent on the tilt of the frame, the thickness variations of the adhesive 75, etc. There is a step h between the first region 71a and the second region 71b of the polyimide film 71. This is because the vapor deposition mask of Example 1 is placed with the polyimide film 71 facing up, and the measurement is performed by the displacement meter from below (from the side of the open mask 72 of the polyimide film 71). The step h corresponds to the total thickness of the open mask 72 and the adhesive 75.

A broken line represents the correction line on the measurement results along the cross sections of the cells C1 to C3. The "correction line" represents the change in the height of the polyimide film 71 (the first region 71a) when the bend of the polyimide film 71 is zero. When the polyimide film 71 has a bend, the actual measurement of the height of the polyimide film 71 is smaller than the height of the correction line. Herein, the maximum value of the height difference between the correction line and the actual measurement (where the actual measurement is a negative value with respect to the height of the correction line) was obtained as the bend amount of the polyimide film 71 along each cross section. The maximum value of the bend amount was used as the "maximum bend amount" of the cell.

As a result, the maximum bend amount was 5 µm or less for any cell. Therefore, it was found that for the vapor deposition mask of Example 1, the first region 71a of the polyimide film 71 has a predetermined tensile stress, irrespective of the position of the cell, and the bend amount (i.e., the height difference between the actual measurement and the correction line) can be suppressed. It was also found that the stress distribution occurring immediately after the heat treatment is decreased (leveled) in the first region 71a of the polyimide film 71.

On the other hand, also for the cell of the vapor deposition mask of Example 2, the bend measurement of the polyimide film 71 was performed to obtain the maximum bend amount by a similar method to that of Example 1.

FIGS. 21(a) to 21(c) and FIGS. 22(a) to 22(c) each show the change in the height of the polyimide film 71 of one cell of the vapor deposition mask of Example 2, showing the measurement results obtained by scanning the polyimide film 71 along lines I-I, II-II, III-III, IV-IV, V-V and VI-VI of FIGS. 14(a) and 14(b).

As a result, it was found that with the vapor deposition mask of Example 2, the maximum bend amount was 400 µm or more and 500 µm or less for each cell, indicating that there was a greater bend than with Example 1. Thus, it was confirmed that it is possible to reduce the bend amount of the polyimide film 71 by increasing the tensile stress of the polyimide film 71.

Note that a resin film having a predetermined tensile stress (e.g., 3 MPa or more) and a conventional resin film formed under conditions such that the tensile stress will be relatively small can be distinguished from each other by, for example, measuring the compressive stress (warp amount) on the support substrate or the magnetic metal body, or measuring the in-plane orientation (IR absorption spectrum) of the resin film. For example, while the IR absorption spectrum is substantially the same for the front surface and for the reverse surface with a conventional resin film, there may occur differences such as a difference in the IR absorption spectrum between the front surface and the reverse surface for a resin film having a large tensile stress. A resin film having a predetermined tensile stress that is attached to an open mask and a conventional resin film secured on a frame while being stretched can also be distinguished from each other by observation using polarized light, for example.

(Method for Manufacturing Organic Semiconductor Device)

A vapor deposition mask according to an embodiment of the present invention can suitably be used in the vapor deposition step in a method for manufacturing an organic semiconductor device.

The following description is directed to, as an example, a method for manufacturing an organic EL display device.

Figure 24:
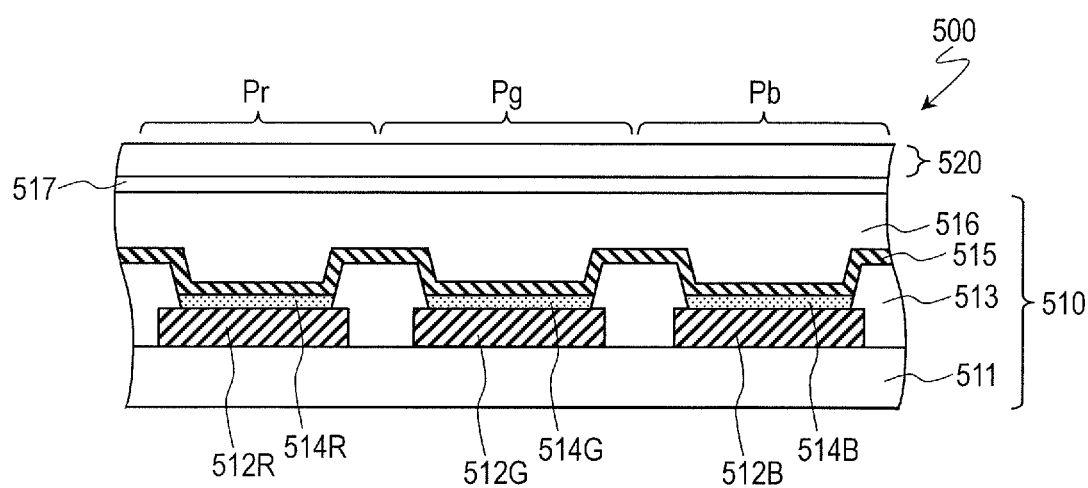
FIG. 24 is a cross-sectional view schematically showing an organic EL display device 500 of a top emission type.

FIG. 24 is a cross-sectional view schematically showing an organic EL display device 500 of a top emission type.

As can be seen from FIG. 24, the organic EL display device 500 includes an active matrix substrate (TFT substrate) 510 and an encapsulation substrate 520, and includes a red pixel Pr, a green pixel Pg and a blue pixel Pb.

The TFT substrate 510 includes an insulative substrate, and a TFT circuit formed on the insulative substrate (neither is shown in the figure). A flattening film 511 is provided so as to cover the TFT circuit. The flattening film 511 is formed from an organic insulative material.

Lower electrodes 512R, 512G and 512E are provided on the flattening film 511. The lower electrodes 512R, 512G and 512B are formed in the red pixel Pr, the green pixel Pg and the blue pixel Pb, respectively. The lower electrodes 512R, 512G and 512B are each connected to the TFT circuit, and function as an anode. A bank 513 covering the edge portion of the lower electrodes 512R, 512G and 512B is provided between adjacent pixels. The bank 513 is formed from an insulative material.

Organic EL layers 514R, 514G and 514B are provided on the lower electrodes 512R, 512G and 512B of the red pixel Pr, the green pixel Pg and the blue pixel Pb, respectively. The organic EL layers 514R, 514G and 514B each have a layered structure including a plurality of layers formed from an organic semiconductor material. For example, the layered structure includes a hole injection layer, a hole transport layer, a light emitting layer, an electron transport layer and an electron injection layer that are arranged in this order from the side of the lower electrodes 512R, 512G and 512B. The organic EL layer 514R of the red pixel Pr includes a light emitting layer that emits red light. The organic EL layer 514G of the green pixel Pg includes a light emitting layer that emits green light. The organic EL layer 514B of the blue pixel Pb includes a light emitting layer that emits blue light.

An upper electrode 515 is provided on the organic EL layers 514R, 514G and 514B. The upper electrode 515 is formed, by using a transparent conductive material, so as to be continuous over the entire display area (i.e., as a shared member among the red pixel Pr, the green pixel Pg and the blue pixel Pb), and functions as a cathode. A protection layer 516 is provided on the upper electrode 515. The protection layer 516 is formed from an organic insulative material.

The structure of the TFT substrate 510 described above is encapsulated by the encapsulation substrate 520, which is bonded to the TFT substrate 510 via a transparent resin layer 517.

The organic EL display device 500 can be produced as follows by using a vapor deposition mask according to an embodiment of the present invention. FIGS. 25(a) to 25(d) and FIGS. 26(a) to 26(d) are cross-sectional views each showing a step in the process of manufacturing the organic EL display device 500. Note that the following description will focus on the step of vapor-depositing an organic semiconductor material on the work (forming the organic EL layers 514R, 514G and 514B on the TFT substrate 510) by using a vapor deposition mask 101R for red pixels, a vapor deposition mask 101G for green pixels and a vapor deposition mask 101B for blue pixels in turns.

Figure 25:
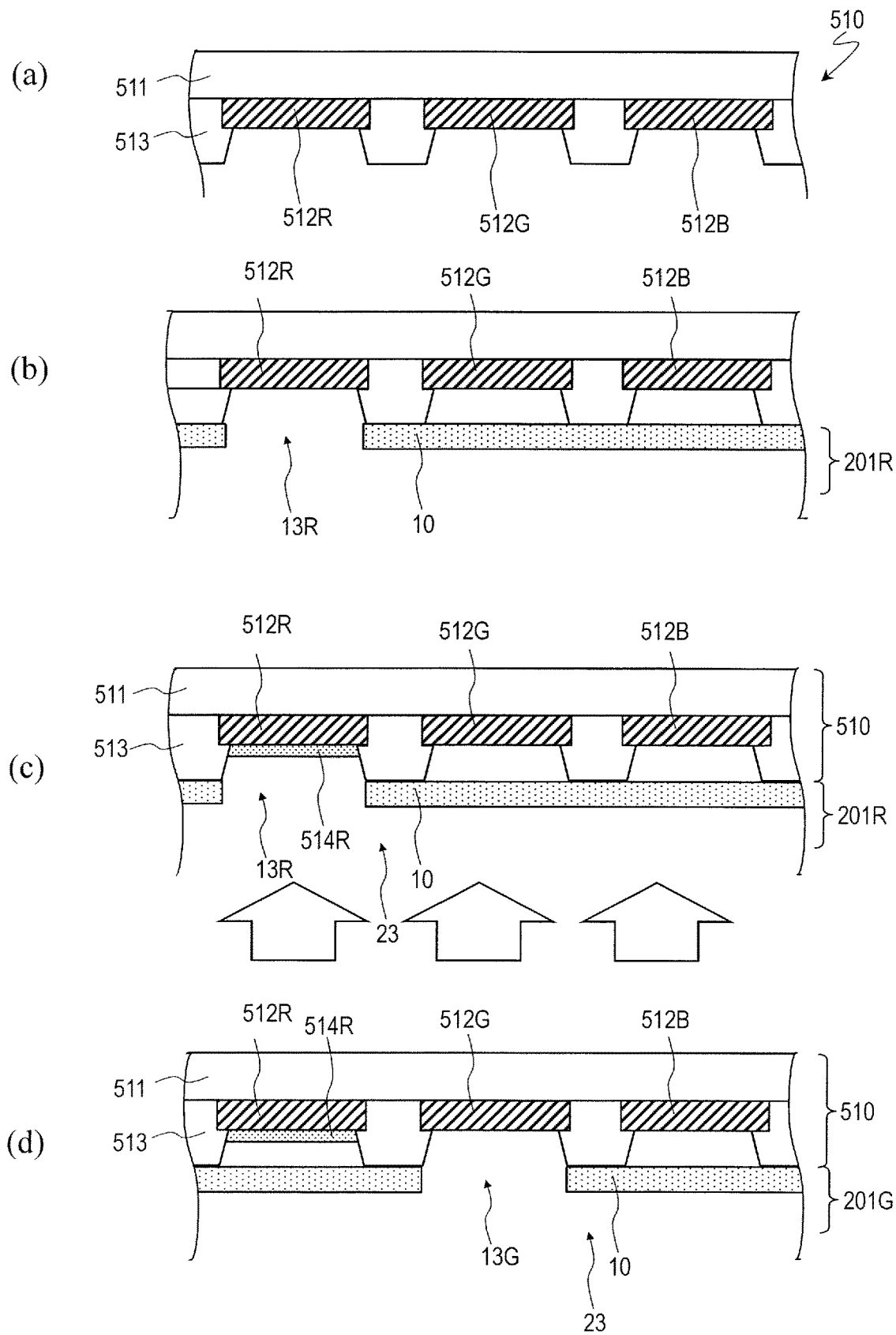
FIGS. 25(a) to 25(d) are cross-sectional views each showing a step in the process of manufacturing the organic EL display device 500.

First, as shown in FIG. 25(a), the TFT substrate 510 is provided, wherein the TFT substrate 510 includes the TFT circuit, the flattening film 511, the lower electrodes 512R, 512G and 512B and the bank 513 formed on an insulative substrate. The steps of forming the TFT circuit, the flattening film 511, the lower electrodes 512R, 512G and 512B and the bank 513 can be carried out by any of various methods known in the art.

Next, as shown in FIG. 25(b), a carrier device is used to arrange the TFT substrate 510 close to the vapor deposition mask 101R, which is held in the vacuum vapor deposition device. In this process, the vapor deposition mask 101R and the TFT substrate 510 are positioned so that the second opening 13R of the resin layer 10 overlaps the lower electrode 512R of the red pixel Pr. A magnetic chuck (not shown) arranged on the opposite side from the vapor deposition mask 101R with respect to the TFT substrate 510 is used to hold the vapor deposition mask 101R in close contact with the TFT substrate 510.

Then, as shown in FIG. 25(c), organic semiconductor materials are successively deposited on the lower electrode 512R of the red pixel Pr by vacuum vapor deposition, thereby forming the organic EL layer 514R including a light emitting layer that emits red light.

Next, as shown in FIG. 25(d), the vapor deposition mask 101G is placed in the vacuum vapor deposition device, replacing the vapor deposition mask 101R. The vapor deposition mask 101G and the TFT substrate 510 are positioned together so that the second opening 13G of the resin layer 10 overlaps the lower electrode 512G of the green pixel Pg. A magnetic chuck is used to hold the vapor deposition mask 101G in close contact with the TFT substrate 510.

Figure 26:
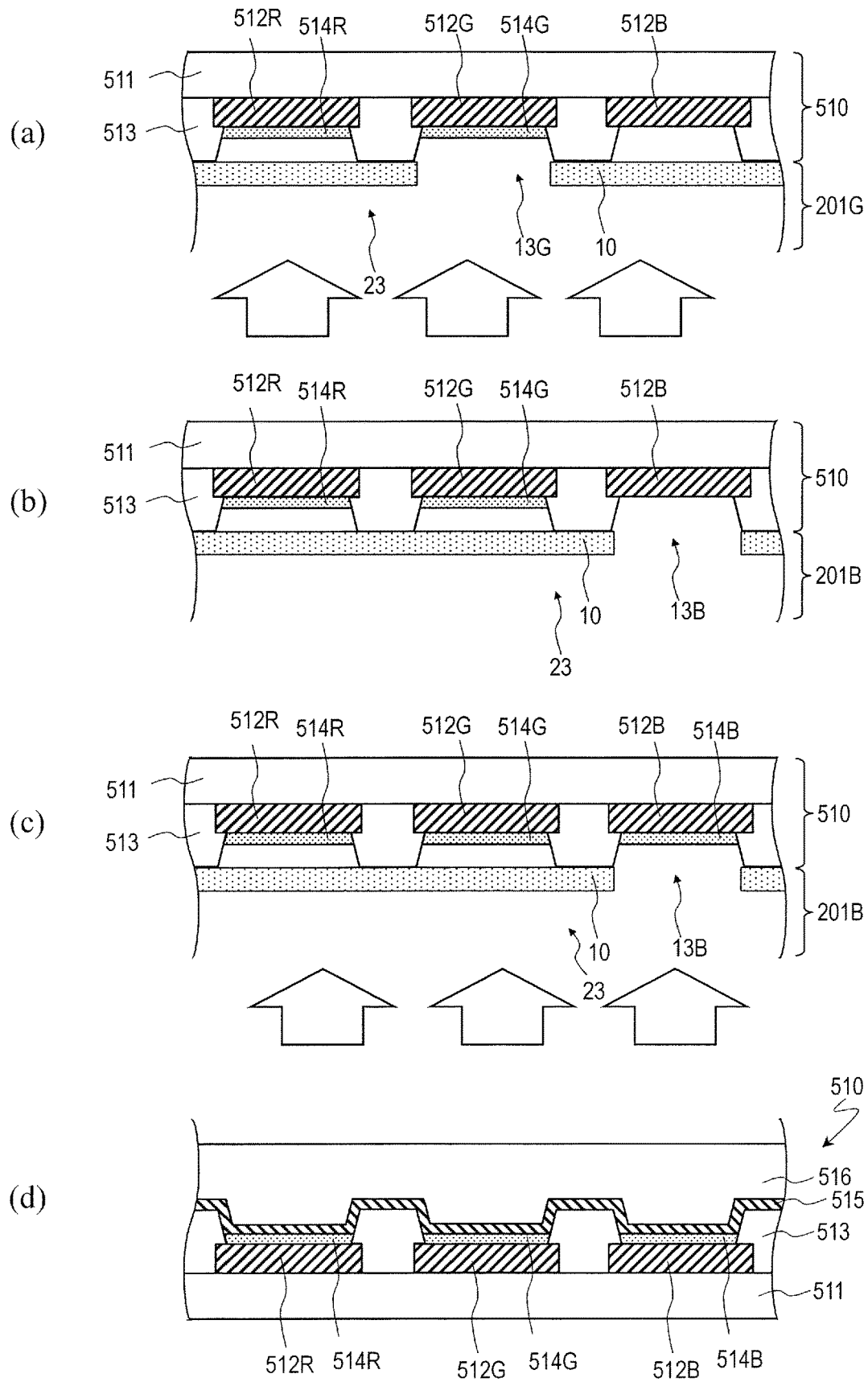
FIGS. 26(a) to 26(d) are cross-sectional views each showing a step in the process of manufacturing the organic EL display device 500.

Then, as shown in FIG. 26(a), organic semiconductor materials are successively deposited on the lower electrode 512G of the green pixel Pg by vacuum vapor deposition, thereby forming the organic EL layer 514G including a light emitting layer that emits green light.

Next, as shown in FIG. 26(b), the vapor deposition mask 101B is placed in the vacuum vapor deposition device, replacing the vapor deposition mask 101G. The vapor deposition mask 101B and the TFT substrate 510 are positioned together so that the second opening 13B of the resin layer 10 overlaps the lower electrode 512B of the blue pixel Pb. A magnetic chuck is used to hold the vapor deposition mask 101B in close contact with the TFT substrate 510.

Then, as shown in FIG. 26(c), organic semiconductor materials are successively deposited on the lower electrode 512B of the blue pixel Pb by vacuum vapor deposition, thereby forming the organic EL layer 514B including a light emitting layer that emits blue light.

Next, as shown in FIG. 26(d), the upper electrode 515 and the protection layer 516 are formed successively on the organic EL layers 514R, 514G and 514B. The formation of the upper electrode 515 and the protection layer 516 can be carried out by any of various methods known in the art. Thus, the TFT substrate 510 is obtained.

Then, the encapsulation substrate 520 is bonded to the TFT substrate 510 via the transparent resin layer 517, thereby completing the organic EL display device 500 shown in FIG. 24.

Note that although three vapor deposition masks 101R, 101G and 101B corresponding respectively to the organic EL layers 514R, 514G and 514B of the red pixel Pr, the green pixel Pg and the blue pixel Pb are used herein, the organic EL layers 514R, 514G and 514B corresponding respectively to the red pixel Pr, the green pixel Pg and the blue pixel Pb may be formed by successively shifting a single vapor deposition mask. With the organic EL display device 500, an encapsulation film may be used instead of the encapsulation substrate 520. Alternatively, instead of using an encapsulation substrate (or an encapsulation film), a thin film encapsulation (TFE) structure may be provided over the TFT substrate 510. A thin film encapsulation structure includes a plurality of inorganic insulating films such as silicon nitride films, for example. The thin film encapsulation structure may further include an organic insulative film.

Note that although the organic EL display device 500 of a top emission type is illustrated in the above description, it is needless to say that the vapor deposition mask of the present embodiment may be used for manufacturing an organic EL display device of a bottom emission type.

An organic EL display device to be manufactured by using the vapor deposition mask of the present embodiment does not necessarily need to be a rigid device. The vapor deposition mask of the present embodiment can suitably be used in the manufacture of a flexible organic EL display device. In a method for manufacturing a flexible organic EL display device, a TFT circuit, etc., are formed on a polymer layer (e.g., a polyimide layer) formed on a support substrate (e.g., a glass substrate), and the polymer layer, together with the layered structure thereon, is removed from the support substrate (e.g., a laser lift off method is used) after the formation of a protection layer.

The vapor deposition mask of the present embodiment may be also used in the manufacture of an organic semiconductor device other than an organic EL display device, and can particularly suitably be used in the manufacture of an organic semiconductor device for which it is necessary to form a vapor deposition pattern having a high definition.

INDUSTRIAL APPLICABILITY

The vapor deposition mask according to an embodiment of the present invention can suitably be used in the manufacture of an organic semiconductor device such as an organic EL display device, and can particularly suitably be used in the manufacture of an organic semiconductor device for which it is necessary to form a vapor deposition pattern having a high definition.

REFERENCE SIGNS LIST

10 Resin layer
10a First region
10b Second region
13 Opening
20 Magnetic metal body
21 Solid pattern portion
25 Opening
30 Mask member
40 Frame
50 Adhesive layer
60 Support substrate
L1, L1, L3 Laser beam
100, 200, 300 Vapor deposition mask
500 Organic EL display device
510 TFT substrate
511 Flattening film
512B, 512G, 512R Lower electrode
513 Bank
514B, 514G, 514R Organic EL layer
515 Upper electrode
516 Protection layer
517 Transparent resin layer
520 Encapsulation substrate
Pb Blue pixel
Pg Green pixel
Pr Red pixel
U Unit region

The invention claimed is:
1. A vapor deposition mask comprising:
a frame;
a magnetic metal body supported on the frame and including at least one first opening;
a resin layer arranged on the magnetic metal body so as to cover the at least one first opening; and an adhesive layer located between the resin layer and the magnetic metal body for attaching together the resin layer and the magnetic metal body, wherein:
the resin layer has a tensile stress in an layer in-plane direction; and
the magnetic metal body receives a compressive stress in an in-plane direction from the resin layer, wherein:
a width of the at least one first opening is 30 mm or more; and
a maximum bend amount δ of a region of the resin layer that is located in the at least one first opening of the magnetic metal body when the magnetic metal body is held in a horizontal direction is 5 μm or less.

2. The vapor deposition mask of claim 1, wherein the tensile stress of the resin layer at room temperature is greater than 0.2 MPa.

3. The vapor deposition mask of claim 1, wherein the adhesive layer is a metal layer fixed on the resin layer, and the metal layer is welded to the magnetic metal body.

4. The vapor deposition mask of claim 1, wherein:
a width of the at least one first opening is 30 mm or more; and
there is no magnetic metal on a region of the resin layer that is located in the at least one first opening of the magnetic metal body.

5. The vapor deposition mask of claim 1, wherein the magnetic metal body has an open mask structure.

6. A method for manufacturing an organic semiconductor device comprising the step of vapor-depositing an organic semiconductor material on a work using the vapor deposition mask of claim 1.

7. A method for manufacturing the vapor deposition mask of claim 1, the method comprising the steps of:
(A) providing a magnetic metal body having at least one first opening;
(B) providing a substrate;
(C) forming a resin layer by applying a solution including a resin material or a varnish of a resin material on a surface of the substrate, and then performing a heat treatment thereon;
(D) securing the resin layer formed on the substrate on the magnetic metal body so as to cover the at least one first opening;
(E) forming a plurality of second openings in the resin layer; and
(F) after the step (E), removing the substrate from the resin layer, wherein:
a width of the at least one first opening is 30 mm or more; and
where δ denotes a maximum bend amount of a region of the resin layer that is located in the at least one first opening of the magnetic metal body when the magnetic metal body is held in a horizontal direction after the substrate is removed in the step (F),
in the step (C), the heat treatment is performed under such a condition that a tensile stress such that the maximum bend amount δ is 5 μm or less is produced on the resin layer.

8. The manufacturing method of claim 7, wherein:
where W denotes a width of the at least one first opening, and
where δ denotes a maximum bend amount of a region of the resin layer that is located in the at least one first opening of the magnetic metal body when the magnetic metal body is held in a horizontal direction after the substrate is removed in the step (F),
in the step (C), the heat treatment is performed under such a condition that a tensile stress such that δ/W is 0.01% or less is applied on the resin layer.

9. The manufacturing method of claim 7, wherein:
the resin layer is a polyimide layer, and the substrate is a glass substrate; and
the heat treatment in the step (C) includes a step of heating the substrate with a solution including the resin material or a varnish of the resin material applied thereon to a temperature of 300° C. or more and 600° C. or less at a rate of 30° C./min or more.

10. The manufacturing method of claim 7, wherein:
the step (E) is performed after the step (D); and
the plurality of second openings are formed in a region of the resin layer that is located in the at least one first opening of the magnetic metal body.

11. The manufacturing method of claim 7, wherein the step (E) is performed between the step (C) and the step (D).

12. The manufacturing method of claim 7, further comprising the step of providing a frame along a peripheral edge portion of the magnetic metal body.

13. The manufacturing method of claim 7, wherein in the step (C), the heat treatment is performed under such a condition that a tensile stress greater than 0.2 MPa is produced on the resin layer at room temperature in a layer in-plane direction.

14. The manufacturing method of claim 7, wherein a compressive stress is applied on the magnetic metal body from the resin layer after the substrate is removed in the step (F).

15. The manufacturing method of claim 7, wherein the step (D) includes the steps of:
(D1) forming an adhesive layer on a portion of the resin layer; and
(D2) attaching the resin layer to the magnetic metal body with the adhesive layer therebetween.

16. The manufacturing method of claim 15, wherein:
the adhesive layer is a metal layer; and
the step (D2) is a step of welding the metal layer to the magnetic metal body, thereby attaching the resin layer to the magnetic metal body with the metal layer therebetween.

17. The manufacturing method of claim 7, wherein a width of the at least one first opening is 30 mm or more, and there is no magnetic metal on a region of the resin layer that is located in the at least one first opening of the magnetic metal body.

18. A vapor deposition mask comprising:
a frame;
a magnetic metal body supported on the frame and including at least one first opening;
a resin layer arranged on the magnetic metal body so as to cover the at least one first opening; and
an adhesive layer located between the resin layer and the magnetic metal body for attaching together the resin layer and the magnetic metal body, wherein:
the resin layer has a tensile stress in an layer in-plane direction; and
the magnetic metal body receives a compressive stress in an in-plane direction from the resin layer, wherein:
δ/W is 0.01% or less, where W denotes a width of the at least one first opening, and δ denotes a maximum bend amount of a region of the resin layer that is located in the at least one first opening of the magnetic metal body when the magnetic metal body is held in a horizontal direction.

19. A method for manufacturing the vapor deposition mask of claim 18, the method comprising the steps of:
- (A) providing a magnetic metal body having at least one first opening;
- (B) providing a substrate;
- (C) forming a resin layer by applying a solution including a resin material or a varnish of a resin material on a surface of the substrate, and then performing a heat treatment thereon;
- (D) securing the resin layer formed on the substrate on the magnetic metal body so as to cover the at least one first opening;
- (E) forming a plurality of second openings in the resin layer; and
- (F) after the step (E), removing the substrate from the resin layer, wherein:
- where W denotes a width of the at least one first opening, and
- where $\delta$ denotes a maximum bend amount of a region of the resin layer that is located in the at least one first opening of the magnetic metal body when the magnetic metal body is held in a horizontal direction after the substrate is removed in the step (F),
- in the step (C), the heat treatment is performed under such a condition that a tensile stress such that $\delta/W$ is 0.01% or less is applied on the resin layer.

20. A method for manufacturing the vapor deposition mask including a resin layer, and a magnetic metal body formed on the resin layer, the method comprising the steps of:
- (A) providing a magnetic metal body having at least one first opening;
- (B) providing a substrate;
- (C) forming a resin layer by applying a solution including a resin material or a varnish of a resin material on a surface of the substrate, and then performing a heat treatment thereon;
- (D) securing the resin layer formed on the substrate on the magnetic metal body so as to cover the at least one first opening;
- (E) forming a plurality of second openings in the resin layer; and
- (F) after the step (E), removing the substrate from the resin layer, wherein:
- the resin layer is a polyimide layer, and the substrate is a glass substrate; and
- the heat treatment in the step (C) includes a step of heating the substrate with a solution including the resin material or a varnish of the resin material applied thereon to a temperature of 300° C. or more and 600° C. or less at a rate of 30° C./min or more.

* * * * *